(12) United States Patent
Shiraishi et al.

(10) Patent No.: US 11,276,602 B2
(45) Date of Patent: Mar. 15, 2022

(54) ELECTROSTATIC CHUCK AND PROCESSING APPARATUS

(71) Applicant: TOTO LTD., Kitakyushu (JP)

(72) Inventors: Jun Shiraishi, Kitakyushu (JP); Shuichiro Saigan, Kitakyushu (JP); Tatsuya Mori, Kitakyushu (JP); Masahiro Watanabe, Kitakyushu (JP); Yuki Sasaki, Kitakyushu (JP)

(73) Assignee: Toto Ltd., Fukuoka (JP)

( * ) Notice: Subject to any disclaimer, the term of this patent is extended or adjusted under 35 U.S.C. 154(b) by 0 days.

(21) Appl. No.: 16/810,404

(22) Filed: Mar. 5, 2020

(65) Prior Publication Data

US 2020/0286768 A1 Sep. 10, 2020

(30) Foreign Application Priority Data

Mar. 5, 2019 (JP) .............................. JP2019-039864
Jan. 30, 2020 (JP) .............................. JP2020-013663

(51) Int. Cl.
*H01L 21/683* (2006.01)
*H01J 37/32* (2006.01)
*H01L 21/67* (2006.01)

(52) U.S. Cl.
CPC .... *H01L 21/6833* (2013.01); *H01J 37/32724* (2013.01); *H01L 21/67017* (2013.01); *H01J 2237/002* (2013.01); *H01L 21/67109* (2013.01)

(58) Field of Classification Search
CPC ........... H01L 21/6833; H01L 21/67017; H01L 21/67109; H01L 21/6831; H01L 21/6875;
(Continued)

(56) References Cited

U.S. PATENT DOCUMENTS 5,720,818 A * 2/1998 Donde ................ C23C 16/4586
118/500
6,490,145 B1 * 12/2002 Kholodenko ....... H01L 21/6831
361/234
(Continued)

FOREIGN PATENT DOCUMENTS

JP H10-50813 A 2/1998
JP 2003-338492 A 11/2003
(Continued)

*Primary Examiner* — Chwen-Wei Su
(74) *Attorney, Agent, or Firm* — Carrier Blackman & Associates, P.C.; William D. Blackman; Joseph P. Carrier

(57) ABSTRACT

According to one embodiment, an electrostatic chuck includes a ceramic dielectric substrate, a base plate, and a first porous part. The ceramic dielectric substrate includes first and second major surfaces, and at least one groove. The second major surface is opposite to the first major surface. The base plate supports the ceramic dielectric substrate and includes a gas feed channel. The first porous part is provided between the groove and the gas feed channel. The ceramic dielectric substrate includes holes communicating with the groove and the gas feed channel and piercing the ceramic dielectric substrate in a first direction from the base plate toward the ceramic dielectric substrate. The first porous part includes at least one porous region including pores, and at least one dense region denser than the porous region. The porous region further includes at least one dense part.

15 Claims, 23 Drawing Sheets

(58) Field of Classification Search
CPC .............. H01L 21/68757; H01L 21/683; H01J 37/32724; H01J 2237/002; H02N 3/00; H02N 13/00; Y10T 279/23
See application file for complete search history.

(56) References Cited

U.S. PATENT DOCUMENTS

| | | | |
|---|---|---|---|
| 6,500,299 B1* | 12/2002 | Mett | ................... C23C 16/4402 |
| | | | 118/723 E |
| 9,165,813 B2* | 10/2015 | Kataigi | ............... H01L 21/6875 |
| 11,011,405 B2* | 5/2021 | Lee | .................... H01L 21/6833 |
| 2009/0086401 A1 | 4/2009 | Samir et al. | |
| 2009/0230636 A1 | 9/2009 | Goto | |
| 2013/0286532 A1 | 10/2013 | Kataigi et al. | |
| 2016/0276198 A1 | 9/2016 | Anada et al. | |
| 2017/0098566 A1 | 4/2017 | Long et al. | |
| 2017/0352568 A1* | 12/2017 | Cho | .................. H01J 37/32715 |
| 2018/0358253 A1* | 12/2018 | Noh | ....................... H02N 13/00 |

FOREIGN PATENT DOCUMENTS

| | | |
|---|---|---|
| JP | 2009-158917 A | 7/2009 |
| JP | 2009-218592 A | 9/2009 |
| JP | 2010-123712 A | 6/2010 |
| JP | 2013-232640 A | 11/2013 |
| TW | 201438141 A | 10/2014 |
| TW | 201725652 A | 7/2017 |

\* cited by examiner

FIG. 14A
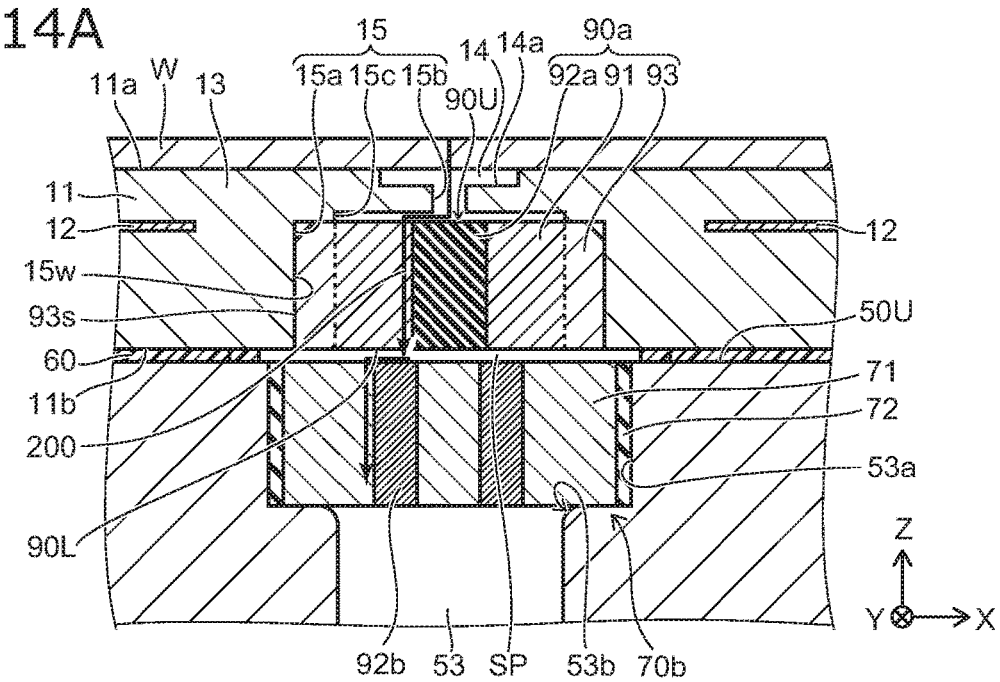
FIG. 14B
FIG. 14C
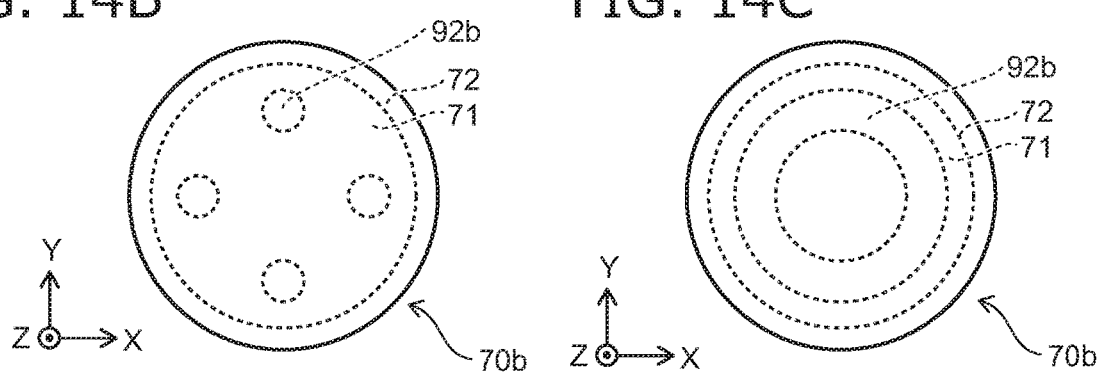

ELECTROSTATIC CHUCK AND PROCESSING APPARATUS

CROSS-REFERENCE TO RELATED APPLICATIONS

This application is based upon and claims the benefit of priority from Japanese Patent Application No. 2019-039864, filed on Mar. 5, 2019, and No. 2020-013663, filed on Jan. 30, 2020; the entire contents of which are incorporated herein by reference.

FIELD

Embodiments of the invention described herein relate to an electrostatic chuck and a processing apparatus.

BACKGROUND

A ceramic electrostatic chuck is fabricated by sandwiching an electrode between ceramic dielectric substrates made of e.g. alumina, followed by firing. Electric power for electrostatic suction is applied to the incorporated electrode. Thus, the electrostatic chuck sucks a substrate such as a silicon wafer by electrostatic force. In such an electrostatic chuck, an inert gas such as helium (He) is passed between the front surface of the ceramic dielectric substrate and the back surface of the suction target substrate to control the temperature of the suction target substrate.

For instance, the temperature increase of the substrate may be associated with processing in a device for processing a substrate such as a CVD (chemical vapor deposition) device, sputtering device, ion implantation device, and etching device. In the electrostatic chuck used in such devices, an inert gas such as He is passed between the ceramic dielectric substrate and the suction target substrate to bring the substrate into contact with the inert gas. Thus, the temperature increase of the substrate is suppressed.

In the electrostatic chuck for controlling the substrate temperature with an inert gas such as He, a hole (gas feed channel) for feeding an inert gas such as He is provided in the ceramic dielectric substrate and a base plate for supporting the ceramic dielectric substrate. The ceramic dielectric substrate is provided with a through hole communicating with the gas feed channel of the base plate. Thus, the inert gas fed from the gas feed channel of the base plate is guided through the through hole of the ceramic dielectric substrate to the back surface of the substrate.

Here, when the substrate is processed in the device, electric discharge (arc discharge) may occur from the plasma in the device toward the metallic base plate. The gas feed channel of the base plate and the through hole of the ceramic dielectric substrate may be likely to constitute a path of discharge. Thus, there is known a technique in which a porous part is provided in the gas feed channel of the base plate and the through hole of the ceramic dielectric substrate to improve resistance (such as breakdown voltage) to arc discharge. For instance, an electrostatic chuck is proposed, in which an insulative property in the gas feed channel is improved by providing a ceramic sintered porous body in the gas feed channel and using the structure and film pore of the ceramic sintered porous body as a gas flow path. An electrostatic chuck is proposed, in which a discharge prevention member made of a ceramic porous body for a process gas flow path is provided in a gas diffusion gap in order to prevent the discharge. An electrostatic chuck is proposed, in which the arc discharge is reduced by providing a dielectric insert as a porous dielectric such as alumina. A technique is proposed, in which a plurality of fine pores communicating with gas supply pores are provided by laser processing.

In such an electrostatic chuck, the arc discharge is desired to be further reduced.

BRIEF DESCRIPTION OF THE DRAWINGS

FIGS. 14A to 14C are schematic sectional views illustrating the porous parts according to the other embodiment;

DETAILED DESCRIPTION

Figure 1:
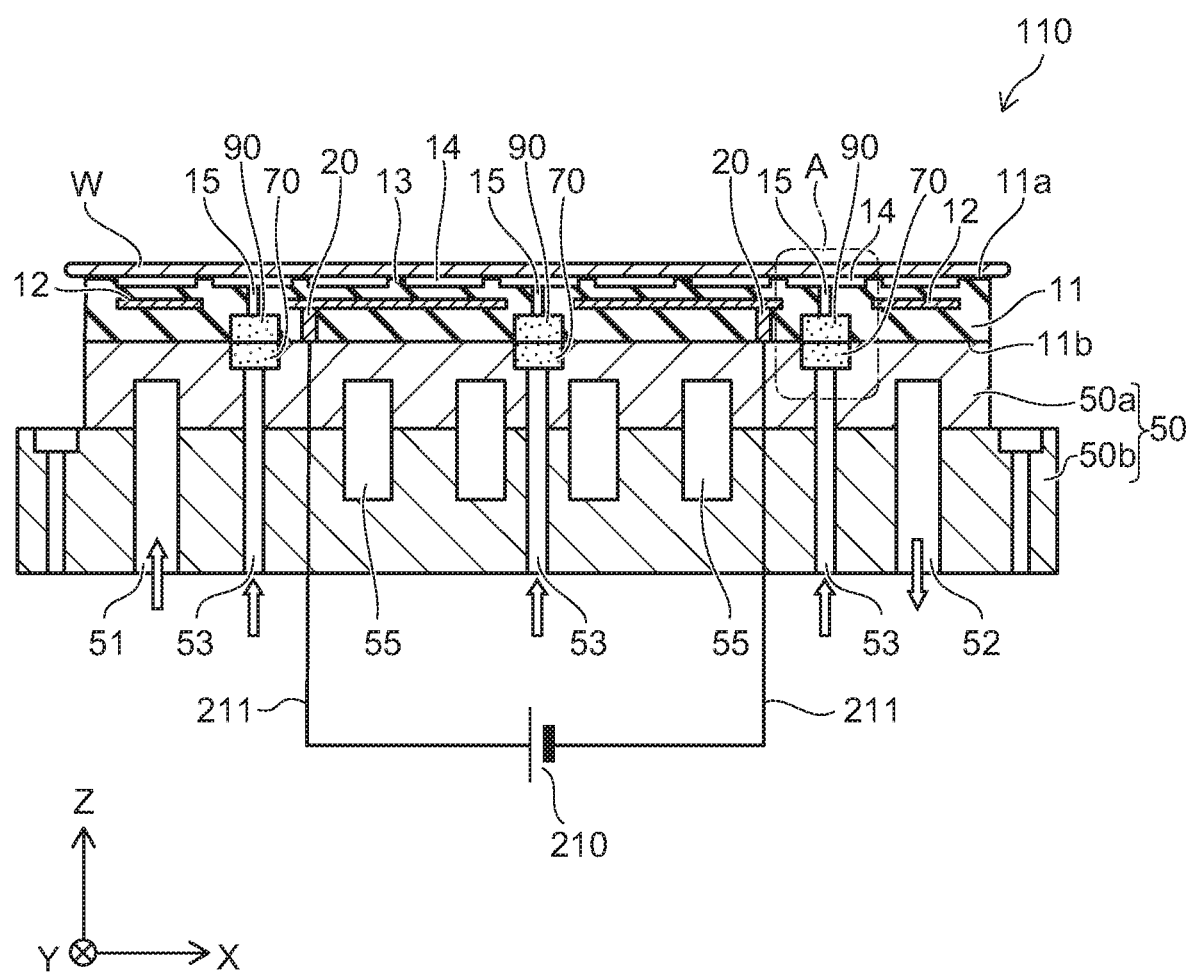
FIG. 1 is a schematic sectional view illustrating an electrostatic chuck according to the first embodiment.

The first invention is an electrostatic chuck including: a ceramic dielectric substrate; a base plate; and a first porous part. The ceramic dielectric substrate includes a first major surface, a second major surface, and at least one groove. A suction target is placed on the first major surface. The second major surface is opposite to the first major surface. The base plate supports the ceramic dielectric substrate and includes a gas feed channel. The first porous part is provided between the groove and the gas feed channel. The ceramic dielectric substrate includes a plurality of holes communicating with the groove and the gas feed channel and piercing the ceramic dielectric substrate in a first direction from the base plate toward the ceramic dielectric substrate. The first porous part includes at least one porous region including a plurality of pores, and at least one dense region denser than the porous region. The porous region further includes at least one dense part. As projected on a plane perpendicular to the first direction, at least one of the plurality of holes provided in the ceramic dielectric substrate is configured to overlap at least one of the dense part.

According to the electrostatic chuck, a current tries to flow around the dense part when flowing in the interior of the porous part. For that reason, a distance (conduction path) where the current flows can be longer, and thus an electron is not easy to be accelerated, and further the occurrence of arc discharge can be suppressed.

The second invention is the electrostatic chuck of the first invention wherein the first porous part is provided in the ceramic dielectric substrate.

According to the electrostatic chuck, a mechanical strength (rigidity) of the ceramic dielectric substrate can be improved.

The third invention is the electrostatic chuck of the first or second invention, further including: a second porous part provided between the groove and the gas feed channel, the second porous part being provided in the base plate.

According to the electrostatic chuck, the arc discharge can be reduced.

The fourth invention is the electrostatic chuck of the first invention, wherein the first porous part is provided in the base plate.

According to the electrostatic chuck, the arc discharge in the base plate can be reduced from occurring.

The fifth invention is the electrostatic chuck of one of the first to fourth inventions, wherein the porous region includes a plurality of sparse portions having a plurality of pores, and a dense portion having a density higher than a density of the sparse portions, the dense portion having a dimension in a second direction substantially perpendicular to the first direction smaller than a dimension of the dense region in the second direction, each of the plurality of sparse portions extends in the first direction, the dense portion is positioned between the plurality of the sparse portions, the sparse portions including a wall part provided between the plurality of pores, and in the second direction substantially perpendicular to the first direction, a minimum value of a dimension of the wall part is smaller than a minimum value of the dimension of the dense portion.

According to the electrostatic chuck, the porous part is provided with the sparse portion and the dense portion extending in the first direction. This can improve the mechanical strength (rigidity) of the porous part while ensuring arc discharge resistance and gas flow rate.

The sixth invention is the electrostatic chuck of the fifth invention, wherein in the second direction, a dimension of the plurality of pores provided in each of the plurality of sparse portions is smaller than the dimension of the dense portion.

According to the electrostatic chuck, the occurrence of arc discharge can be more effectively suppressed.

The seventh invention is the electrostatic chuck of the fifth or sixth invention, wherein an aspect ratio of the plurality of pores provided in each of the plurality of sparse portions is 30 or more.

According to the electrostatic chuck, the arc discharge resistance can be further improved.

The eighth invention is the electrostatic chuck of one of the first to seventh inventions, wherein in the second direction, a dimension of the plurality of pores provided in each of the plurality of sparse portions is not less than 1 micrometer and not more than 20 micrometers.

According to the electrostatic chuck, pores having a pore dimension of 1 to 20 micrometers and extending in one direction can be arranged. This can realize a high resistance to the arc discharge.

The ninth invention is the electrostatic chuck of one of the fifth invention to eighth inventions, wherein as viewed along the first direction, the plurality of pores include a first pore positioned at a center of the sparse portions, and among the plurality of pores, a number of pores adjacent to and surrounding the first pore is 6.

According to the electrostatic chuck, in a plan view, a plurality of pores can be arranged with a high isotropy and a high density. This can improve the rigidity of the first porous part while ensuring arc the discharge resistance and the gas flow rate.

The tenth invention is the electrostatic chuck of one of the first to ninth inventions, wherein a length along the first direction of the dense part is smaller than a length along the first direction of the first porous part.

According to the electrostatic chuck, the gas flow can be smoothed while suppressing the occurrence of arc discharge The eleventh invention is the electrostatic chuck one of the first to ninth inventions, wherein a length along the first direction of the dense part is substantially equal to a length along the first direction of the first porous part.

According to the electrostatic chuck, a length along the first direction of the dense part is made substantially as long as a length along the first direction of the first porous part, thus the occurrence of arc discharge can be suppressed more effectively.

The twelfth invention is the electrostatic chuck of one of the first to eleventh inventions, wherein at least a part of an edge of an opening on the ceramic dielectric substrate side of the gas feed channel is configured to be a curve.

According to the electrostatic chuck, at least a part of the edge of the opening of the gas feed channel is configured to be a curve. This can reduce suppress the electric field concentration, and further can reduce the arc discharge.

The thirteenth invention is the electrostatic chuck of one of the first to thirteenth inventions, wherein at least one of the plurality of holes provided in the ceramic dielectric substrate includes a first portion opening to the groove and a second portion communicating with the first portion and opening to the second major surface, and in the second direction substantially orthogonal to the first direction, a dimension of the first portion is smaller than a dimension of the second portion.

According to the electrostatic chuck, the occurrence of arc discharge can be more effectively suppressed.

The fourteenth invention is the electrostatic chuck of one of the first to thirteenth inventions, wherein at least one of the plurality of holes provided in the ceramic dielectric substrate satisfies $\alpha < \beta$, when an angle between an edge of an opening of the holes on the groove side and a bottom surface of the groove is taken as α, and an angle between an edge of an opening of the holes on the second major surface side and the second major surface is taken as β.

According to the electrostatic chuck, the electric field concentration can be suppressed, and further the arc discharge can be reduced.

The fifteenth invention is the electrostatic chuck of one of the first to fourteenth inventions, wherein at least one of the plurality of holes provided in the ceramic dielectric substrate is inclined to the first direction.

According to the electrostatic chuck, at least one of the plurality of holes is inclined to the first direction. Thus, it is considered that electrons are less likely to be accelerated in current flow in the holes. Thus, the occurrence of arc discharge can be more effectively suppressed.

The sixteenth invention is the electrostatic chuck of the fifteenth invention, wherein an angle to the first direction is not less than 5° and not more than 30°.

According to the electrostatic chuck, the occurrence of arc discharge can be suppressed without making a diameter of the hole small.

The seventeenth invention is an electrostatic chuck, including: a ceramic dielectric substrate including a first major surface, a second major surface, and at least one groove opening to the first major surface, a suction target being placed on the first major surface, the second major surface being opposite to the first major surface; a base plate supporting the ceramic dielectric substrate and including a gas feed channel; and a first porous part provided between the groove and the gas feed channel. The ceramic dielectric substrate includes a plurality of holes communicating with the groove and the gas feed channel and piercing the ceramic dielectric substrate in a first direction from the base plate toward the ceramic dielectric substrate. At least one of the plurality of holes is inclined to the first direction. If at least one of the plurality of holes is inclined to the first direction, electrons are less likely to be accelerated in current flow in the holes. Thus, the occurrence of arc discharge can be more effectively suppressed.

The eighteenth invention is a processing apparatus including: one of the electrostatic chucks described above; and a supplier configured to supply a gas into a gas feed channel provided in the electrostatic chuck.

According to the electrostatic chuck, the arc discharge can be reduced.

Various embodiments are described below with reference to the accompanying drawings.

In the drawings, similar components are marked with like reference numerals, and a detailed description is omitted as appropriately.

In the drawings, a direction from a base plate 50 toward a ceramic dielectric substrate 11 is taken as a Z-direction (corresponding to one example of a first direction), one of directions substantially orthogonal to the Z-direction is taken as a Y-direction (corresponding to one example of a second direction), and a direction substantially perpendicular to the Z-direction and the Y direction is taken as an X-direction (corresponding to one example of the second direction).

(Electrostatic Chuck)

FIG. 1 is a schematic sectional view illustrating an electrostatic chuck according to the embodiment.

As shown in FIG. 1, an electrostatic chuck 110 according to the embodiment includes the ceramic dielectric substrate 11, the base plate 50, and a porous part 90. In this example, the electrostatic chuck 110 further includes a porous part 70.

The ceramic dielectric substrate 11 is e.g. a flat plate-like base material made of sintered ceramic. For instance, the ceramic dielectric substrate 11 includes aluminum oxide ($Al_2O_3$). For instance, the ceramic dielectric substrate 11 is formed of high-purity aluminum oxide. The concentration of aluminum oxide in the ceramic dielectric substrate 11 is e.g. not less than 99 atomic percent (atomic %) and not more than 100 atomic %. Use of high-purity aluminum oxide can improve the plasma resistance of the ceramic dielectric substrate 11. The ceramic dielectric substrate 11 has a first major surface 11a on which a target W (suction target) is placed, and a second major surface 11b on the opposite side from the first major surface 11a. The target W is e.g. a semiconductor substrate such as a silicon wafer.

The ceramic dielectric substrate 11 is provided with an electrode 12. The electrode 12 is provided between the first major surface 11a and the second major surface 11b of the ceramic dielectric substrate 11. The electrode 12 is formed so as to be inserted in the ceramic dielectric substrate 11. A power supply 210 is electrically connected to the electrode 12 via a connection part 20 and a wiring 211. By application of a suction-holding voltage to the electrode 12 from the power supply 210, charge is generated on the first major surface 11a side of the electrode 12 and the target W can be suction-held by electrostatic force.

The electrode 12 is shaped like a thin film along the first major surface 11a and the second major surface 11b of the ceramic dielectric substrate 11. The electrode 12 is a suction electrode for suction-holding the target W. The electrode 12 may be of the unipolar type or the bipolar type. The electrode 12 illustrated in FIG. 1 is of the bipolar type, with electrodes 12 of two polarities provided on the same plane.

The electrode 12 is provided with a connection part 20 extending to the second major surface 11b side of the ceramic dielectric substrate 11. The connection part 20 is e.g. a via (solid type) or via hole (hollow type) in electrical continuity with the electrode 12. The connection part 20 may be a metal terminal connected by a suitable method such as brazing.

The base plate 50 is a member for supporting the ceramic dielectric substrate 11. The ceramic dielectric substrate 11 is fixed on the base plate 50 with a bonding part 60 shown in FIG. 2A. The bonding part 60 can be e.g. a cured silicone adhesive.

The base plate 50 is e.g. metallic. The base plate 50 is e.g. divided into an upper part 50a and a lower part 50b made of aluminum. A communication channel 55 is provided between the upper part 50a and the lower part 50b. One end side of the communication channel 55 is connected to an input channel 51. The other end side of the communication channel 55 is connected to an output channel 52. The base plate 50 may include a sprayed part (not shown) on an end on the second major surface 11b side. The sprayed part is formed by thermal spraying, for instance. The sprayed part may constitute an end surface (upper surface 50U) on the second major surface 11b side of the base plate 50. The sprayed part is provided as necessary, and may be omitted.

The base plate 50 also serves to adjust the temperature of the electrostatic chuck 110. For instance, in the case of cooling the electrostatic chuck 110, a cooling medium is caused to flow in from the input channel 51, to pass through the communication channel 55, and to flow out from the output channel 52. This can absorb heat from the base plate 50 by the cooling medium to cool the ceramic dielectric substrate 11 attached onto the base plate 50. On the other hand, in the case of keeping warm the electrostatic chuck 110, a heat-retaining medium can be put into the communication channel 55. Alternatively, a heating element can be incorporated in the ceramic dielectric substrate 11 or the base plate 50. Thus, the temperature of the base plate 50 and the ceramic dielectric substrate 11 is adjusted. This can adjust the temperature of the target W suction-held by the electrostatic chuck 110.

Dots 13 are provided as necessary on the first major surface 11a side of the ceramic dielectric substrate 11. A groove 14 is provided between the dots 13. That is, the first major surface 11a is a protrusion-depression surface and includes a depression and a protrusion. The protrusion of the first major surface 11a corresponds to the dot 13. The depression of the first major surface 11a corresponds to the groove 14. For instance, the groove 14 can extend continuously in the X-Y plane. Thereby, a gas such as He or the like can be distributed over the whole first major surface 11a. A space is formed between the back surface of the target W placed on the electrostatic chuck 110 and the first major surface 11a including the groove 14.

The ceramic dielectric substrate 11 includes a through hole 15 connected to the groove 14. The through hole 15 is provided from the second major surface 11b to the first major surface 11a. That is, the through hole 15 extends in the Z-direction from the second major surface 11b to the first major surface 11a and penetrates through the ceramic dielectric substrate 11. The through hole 15 includes, for instance, a hole part 15a, a hole part 15b, a hole part 15c, a hole part 15d (described later in detail).

The height of the dot 13 (the depth of the groove 14), the area ratio between the dots 13 and the grooves 14, the shapes thereof and the like can be appropriately selected to control the temperature of the target W and particles attached to the target W in a desirable state.

The base plate 50 is provided with a gas feed channel 53. For instance, the gas feed channel 53 is provided so as to penetrate through the base plate 50. The gas feed channel 53 may not penetrate through the base plate 50, but may branch halfway from another gas feed channel 53 and extend to the ceramic dielectric substrate 11 side. The gas feed channel 53 may be provided at a plurality of locations in the base plate 50.

The gas feed channel 53 communicates with the through hole 15. That is, the gas (such as helium (He)) flowing into the gas feed channel 53 passes through the gas feed channel 53, and then flows into the through hole 15.

The gas flowing into the through hole 15 passes through the through hole 15, and then flows into the space provided between the target W and the first major surface 11a including the groove 14. This can directly cool the target W with the gas.

The first porous part 90 can be provided at a position e.g. between the base plate 50 and the first major surface 11a of the ceramic dielectric substrate 11 in the Z-direction. The porous part 90 can be provided at a position opposed to the gas feed channel 53. For instance, the porous part 90 is provided in the through hole 15 of the ceramic dielectric substrate 11. For instance, the first porous part 90 is inserted into the through hole 15.

Figure 2A:
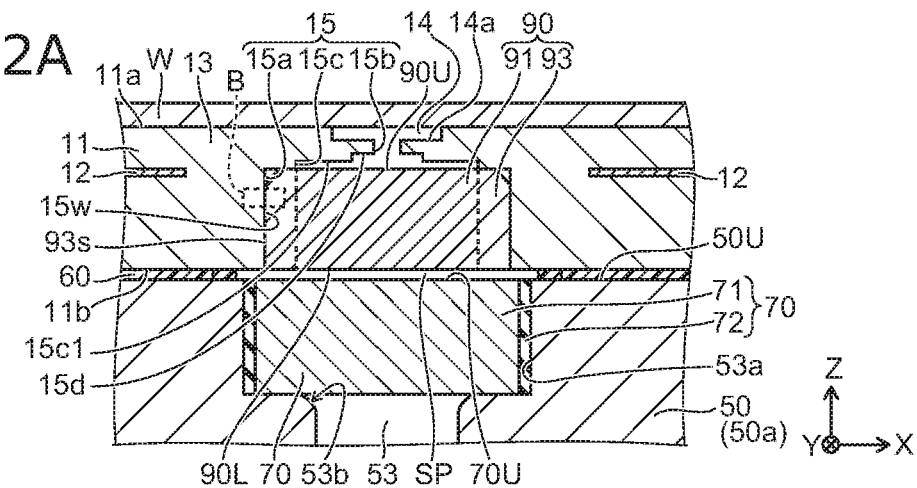
FIGS. 2A to 2D are schematic views illustrating the electrostatic chuck according to the embodiment.
Figure 2B:
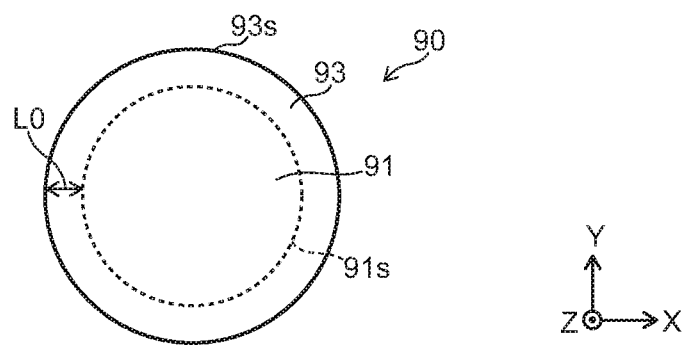

FIGS. 2A and 2B are schematic views illustrating the electrostatic chuck according to the embodiment. FIG. 2A illustrates the neighborhood of the porous part 90 and the porous part 70. FIG. 2A corresponds to an enlarged view of region A shown in FIG. 1. FIG. 2B is a plan view illustrating the porous part 90.

Figure 2C:
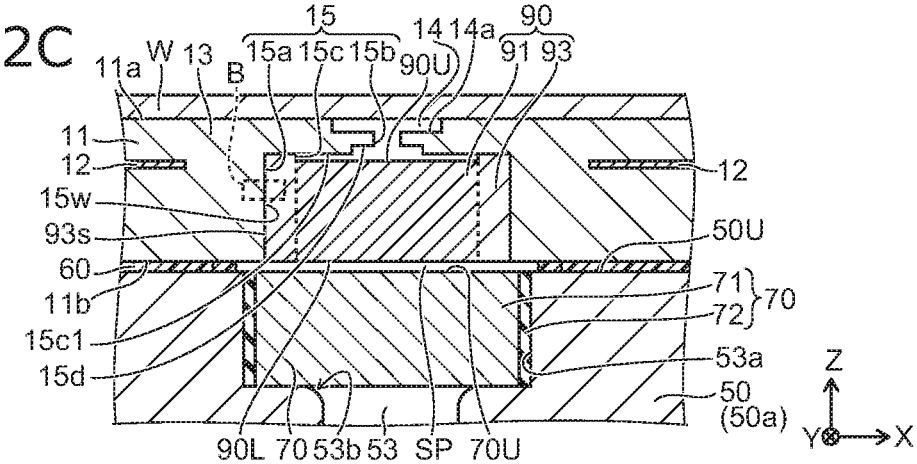
Figure 2D:
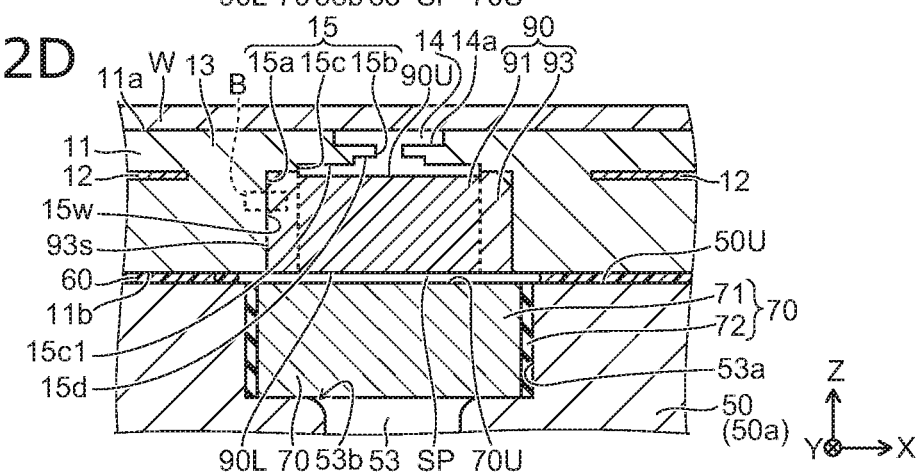

FIGS. 2C and 2D are schematic sectional views for illustrating the hole part 15c and the hole part 15d according to the other embodiment.

In order to avoid complexity, the dots 13 (see e.g. FIG. 1) are omitted in FIGS. 2A, 2C, and 2D.

In this example, the through hole 15 includes the hole part 15a and the hole part 15b (the first hole part). One end of the hole part 15a is positioned on the second major surface 11b of the ceramic dielectric substrate 11.

The ceramic dielectric substrate 11 can include the hole part 15b positioned between the first major surface 11a and the porous part 90 in the Z-direction. The hole part 15b communicates with the hole part 15a and extends to the first major surface 11a of the ceramic dielectric substrate 11. That is, one end of the hole part 15b is positioned on the first major surface 11a (a bottom surface 14a of the groove 14). The hole part 15b is positioned between the first major surface 11a of the ceramic dielectric substrate 11 and the porous part 90. The hole part 15b is a link hole for linking the first porous part 90 and the groove 14. The diameter (length along the X-direction) of the hole part 15b is smaller than the diameter (length along the X-direction) of the hole part 15a. Providing a hole part 15b having a small diameter can improve the design flexibility of the space formed between the ceramic dielectric substrate 11 and the target W (e.g. the first major surface 11a including the groove 14). For instance, as shown in FIG. 2A, the width (length along the X-direction) of the groove 14 can be made shorter than the width (length along the X-direction) of the porous part 90. This can suppress discharge in e.g. the space formed between the ceramic dielectric substrate 11 and the target W.

The diameter of the hole part 15b is e.g. not less than 0.05 millimeters (mm) and not more than 0.5 mm. The diameter of the hole part 15a is e.g. not less than 1 mm and nor more than 5 mm. The hole part 15b may communicate indirectly with the hole part 15a. That is, a hole part 15c (the second hole part) may be provided to connect the hole part 15a and the hole part 15b. As illustrated in FIG. 2A, the hole part 15c can be provided in the ceramic dielectric substrate 11. Alternatively, as illustrated in FIG. 2C, the hole part 15c can be provided in the porous part 90. Alternatively, as illustrated in FIG. 2D, the hole part 15c can be provided in the ceramic dielectric substrate 11 and the porous part 90. That is, at least one of the ceramic dielectric substrate 11 and the porous part 90 can include a hole part 15c located between the hole part 15b and the porous part 90. In this case, when the hole part 15c is provided in the ceramic dielectric substrate 11, the strength around the hole part 15c can be increased, and the occurrence of e.g. chipping can be suppressed around the hole part 15c. This can suppress the occurrence of arc discharge more effectively. When the hole part 15c is provided in the porous part 90, the hole part 15c is easily aligned with the porous part 90. This further facilitates the compatibility between reduction of arc discharge and smoothing of the flow of gas. Each of the hole part 15a, the hole part 15b, and the hole part 15c is shaped like e.g. a circular cylinder extending in the Z-direction.

In this case, in the X-direction or the Y-direction, the dimension of the hole part 15c can be made smaller than the dimension of the porous part 90 and larger than the dimension of the hole part 15b. In the electrostatic chuck 110 according to the embodiment, the porous part 90 is provided at a position opposed to the gas feed channel 53. This can improve resistance to arc discharge while ensuring the flow rate of the gas flowing in the hole part 15b. The dimension in the X-direction or the Y-direction of the hole part 15c is made larger than the dimension of the hole part 15b. Thus, most of the gas fed into the porous part 90 having a large dimension can be fed through the hole part 15c into the hole part 15b having a small dimension. That is, reduction of arc discharge can be made compatible with smoothing of the flow of gas.

As described above, the ceramic dielectric substrate 11 includes at least one groove 14 opened to the first major surface 11a and communicating with the through hole 15. The dimension of the hole part 15c in the Z-direction can be smaller than the dimension of the groove 14 in the Z-direction. This can reduce the time taken by the gas to pass through the hole part 15c. That is, the occurrence of arc discharge can be suppressed more effectively while smoothing the flow of gas. In the X-direction and the Y-direction, the dimension of the hole part 15c can be larger than the dimension of the groove 14. Thus, the gas can be made easy to flow into the groove 14. This makes it possible to effectively cool the target W by the gas.

It is favorable to make an arithmetic average surface roughness Ra of a surface 15c1 (ceiling surface) on the first major surface 11a side smaller than an arithmetic average surface roughness Ra of the bottom surface 14a (a surface on the second major surface 11b side) of the groove 14. In this way, since there is no large unevenness on the surface 15c1 of the hole part 15c, the occurrence of arc discharge can be suppressed more effectively.

It is favorable to make an arithmetic average surface roughness Ra of the surface 14a on the second major surface 11b side on the groove 14 smaller than an arithmetic average surface roughness of the second major surface 11b. In this way, since there is no large unevenness on the surface 14a of the grove 14, the occurrence of arc discharge can be suppressed more effectively.

The hole part 15c (third hole part) provided between the hole part 15b and the hole part 15c can be further included. In the X-direction or the Y-direction, the dimension of the hole part 15d can be made larger than the hole part 15b, and smaller than the hole part 15c. Providing the hole part 15d can make the flow of gas smooth.

As described above, a bonding part 60 can be provided between the ceramic dielectric substrate 11 and the base plate 50. In the Z-direction, the dimension of the hole part 15c can be made smaller than the dimension of the bonding part 60. This can improve the bonding strength between the ceramic dielectric substrate 11 and the base plate 50. The dimension of the hole part 15c in the Z-direction is made smaller than the dimension of the bonding part 60. Thus, the occurrence of arc discharge can be suppressed more effectively while smoothing the flow of gas.

In this example, the porous part 90 is provided in the hole part 15a. Thus, the upper surface 90U of the porous part 90 is not exposed to the first major surface 11a. That is, the upper surface 90U of the porous part 90 is located between the first major surface 11a and the second major surface 11b. On the other hand, the lower surface 90L of the porous part 90 is exposed to the second major surface 11b.

Next, the porous part 90 will be described. The porous part 90 includes a plurality of sparse portions 94 and a plurality of dense portions 95 described later. FIG. 2 illustrates a case of providing the porous part 90 in the ceramic substrate 11, however as described later, the porous part 90 may be provided in the base plate 50 (for instance, FIG. 12B etc.).

The porous part 90 includes a porous region 91 one example of a first porous region, a second porous region) including a plurality of pores 96, and a dense region 93 (one example of a first dense region, a second dense region) denser than the porous region 91. The porous region 91 is configured to allow the gas flow. The gas flows inside each of the plurality of pores 96. The dense region 93 is a region having pores 96 less than the porous region 91 or a region having substantially no pore 96. The porosity (percent: %) of the dense region 93 is lower than the porosity (%) of the porous region 91. The density (gram/cubic centimeter: g/cm$^3$) of the dense region 93 is higher than the density (g/cm$^3$) of the porous region 91. Since the dense region 93 is dense in comparison with the porous region 91, for instance, the rigidity (mechanical strength) of the dense region 93 is higher than the rigidity of the porous region 91.

The porosity of the dense region 93 is e.g. a proportion that the volume of space (pore 96) included in the dense region 93 occupies in the total volume of the dense region 93. The porosity of the porous region 91 is e.g. a proportion that the volume of space (pore 96) included in the porous region 91 occupies in the total volume of the porous region 91. For instance, the porosity of the porous region 91 is not less than 5% and not more than 40%, favorably not less than 10% and not more than 30%, and the porosity of the dense region 93 is not less than 0% and not more than 5%.

The porous part 90 is shaped like a column (e.g. circular column). The porous region 91 is shaped like a column (e.g. circular column). The dense region 93 is in contact with the porous region 91, or is continuous with the porous region 91. As shown in FIG. 2B, as projected on a plane (XY-plane) perpendicular to the Z-direction, the dense region 93 surrounds the outer periphery of the porous region 91. The dense region 93 is shaped like a cylinder (e.g. circular cylinder) surrounding the side surface 91s of the porous region 91. In other words, the porous region 91 is provided so as to penetrate through the dense region 93 in the Z-direction. The gas flowing from the gas feed channel 53 into the through hole 15 passes through the plurality of pores 96 provided in the porous region 91 and is supplied to the groove 14.

The porous part 90 includes the porous region 91 as described above. This can improve resistance to arc discharge while ensuring the flow rate of the gas flowing in the through hole 15. The porous part 90 includes the dense region 93. This can improve the rigidity (mechanical strength) of the porous part 90.

When the porous part 90 is provided in the ceramic dielectric substrate 11, for instance, the first porous part 90 may be integrated with the ceramic dielectric substrate 11. The state in which two members are integrated refers to the state in which the two members are chemically coupled by e.g. sintering. No material (e.g. adhesive) for fixing one member to the other is provided between the two members. That is, in this example, no other member such as adhesive is provided between the porous part 90 and the ceramic dielectric substrate 11. Thus, the porous part 90 and the ceramic dielectric substrate 11 are integrated with each other.

Thus, when the first porous part 90 is fixed to the ceramic dielectric substrate 11 by integration with the ceramic dielectric substrate 11, the strength of the electrostatic chuck 110 can be improved compared with the case of fixing the porous part 90 to the ceramic dielectric substrate 11 with e.g. adhesive. For instance, there is no degradation of the electrostatic chuck due to e.g. corrosion or erosion of adhesive.

When the porous part 90 and the ceramic dielectric substrate 11 are integrated with each other, the side surface of the outer periphery of the porous part 90 may be subjected to a force from the ceramic dielectric substrate 11. On the other hand, when the porous part 90 is provided with a plurality of pores to ensure the flow rate of gas, the mechanical strength of the porous part 90 is decreased. Thus, when the porous part is integrated with the ceramic dielectric substrate 11, the porous part 90 may be broken by the force applied from the ceramic dielectric substrate to the porous part 90.

On the contrary, the porous part 90 includes the dense region 93. This can improve the rigidity (mechanical strength) of the porous part 90, and the porous part 90 can be integrated with the ceramic dielectric substrate 11.

Figure 11:
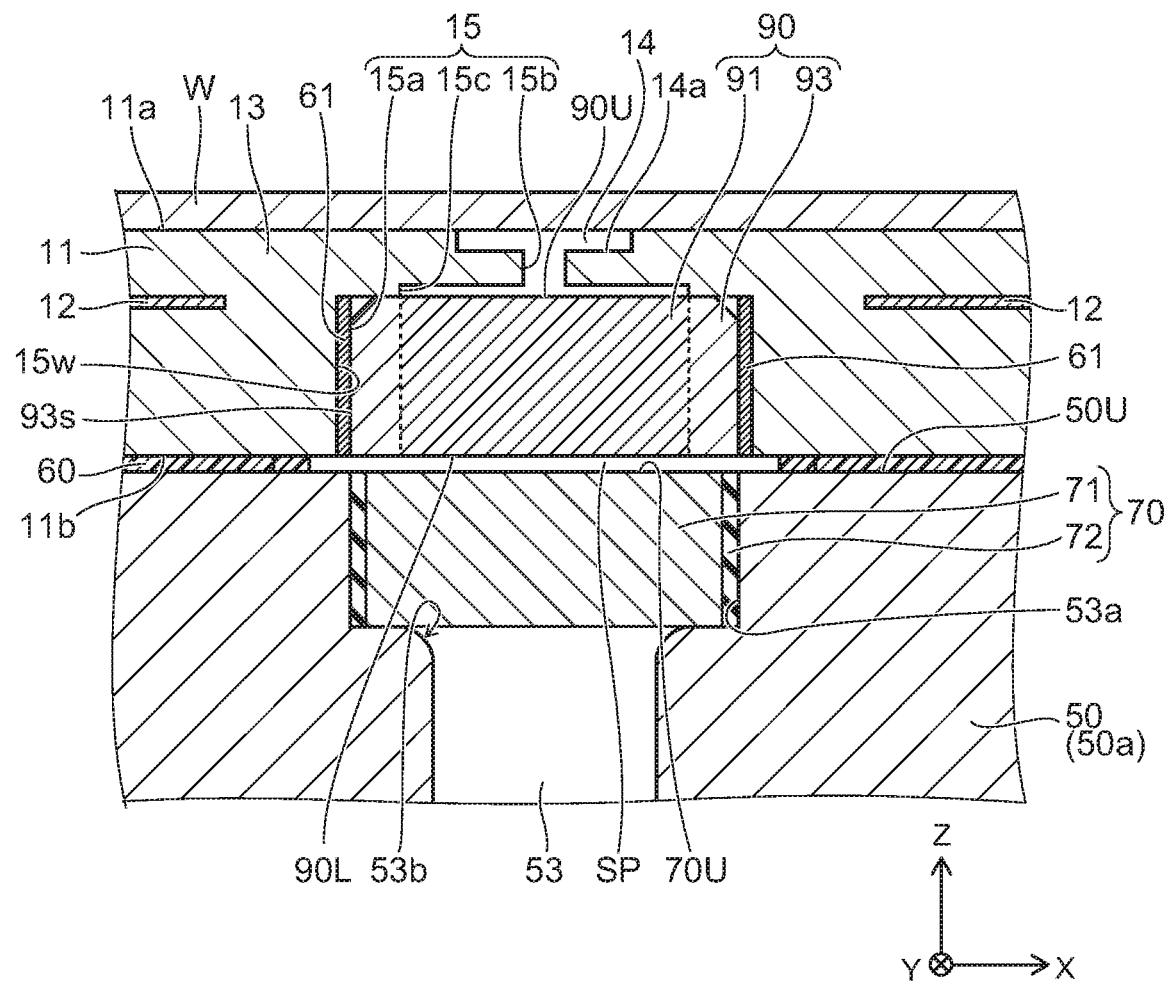
FIG. 11 is a schematic sectional view illustrating a porous part according to the other embodiment.

In the embodiment, the porous part 90 does not necessarily need to be integrated with the ceramic dielectric substrate 11. For instance, as shown in FIG. 11, the porous part 90 may be attached to the ceramic dielectric substrate with adhesive.

The dense region 93 is positioned between the inner wall 15w of the ceramic dielectric substrate 11 forming the through hole 15, and the porous region 91. That is, the porous region 91 is provided inside the porous part 90. The dense region 93 is provided outside the porous part 90. This can improve the rigidity against the force applied from the ceramic dielectric substrate 11 to the porous part 90. Thus, the porous part 90 and the ceramic dielectric substrate 11 can be easily integrated with each other. For instance, a bonding member 61 (see FIG. 11) may be provided between the porous part 90 and the ceramic dielectric substrate 11. In this case, the dense region 93 can suppress that the bonding member 61 is exposed to the gas passing in the porous part 90. This can suppress degradation of the bonding member 61. The porous region 91 is provided inside the porous part 90. This can suppress that the through hole 15 of the ceramic dielectric substrate 11 is occluded with the dense region 93. Thus, the flow rate of gas can be ensured.

The thickness of the dense region 93 (length L0 between the side surface 91s of the porous region 91 and the side surface 93s of the dense region 93) is e.g. not less than 100 μm and not more than 1000 μm.

The material of the porous part 90 is an insulative ceramic. The porous part 90 (each of the porous region 91, and the dense region 93) includes at least one of aluminum oxide ($Al_2O_3$), titanium oxide ($TiO_2$), and yttrium oxide ($Y_2O_3$). This can achieve high breakdown voltage and high rigidity of the porous part 90.

For instance, the porous part 90 is composed primarily of one of aluminum oxide, titanium oxide, and yttrium oxide.

In this case, the purity of aluminum oxide of the ceramic dielectric substrate 11 can be made higher than the purity of aluminum oxide of the porous part 90. This can ensure the performance of the electrostatic chuck 110 such as plasma resistance, and ensure the mechanical strength of the porous part 90. As an example, a trace amount of additive is contained in the porous part 90. This facilitates sintering the porous part 90, and can control the pores and ensure the mechanical strength.

In the specification, the ceramic purity of e.g. aluminum oxide of the ceramic dielectric substrate 11 can be measured by e.g. fluorescent X-ray analysis or ICP-AES method (inductively coupled plasma-atomic emission spectrometry).

For instance, the material of the porous region 91, and the material of the dense region 93 are the same. However, the material of the porous region 91, and the material of the dense region 93 may be different. The composition of the material of the porous region 91, and the composition of the material of the dense region 93 may be different.

Figure 3A:
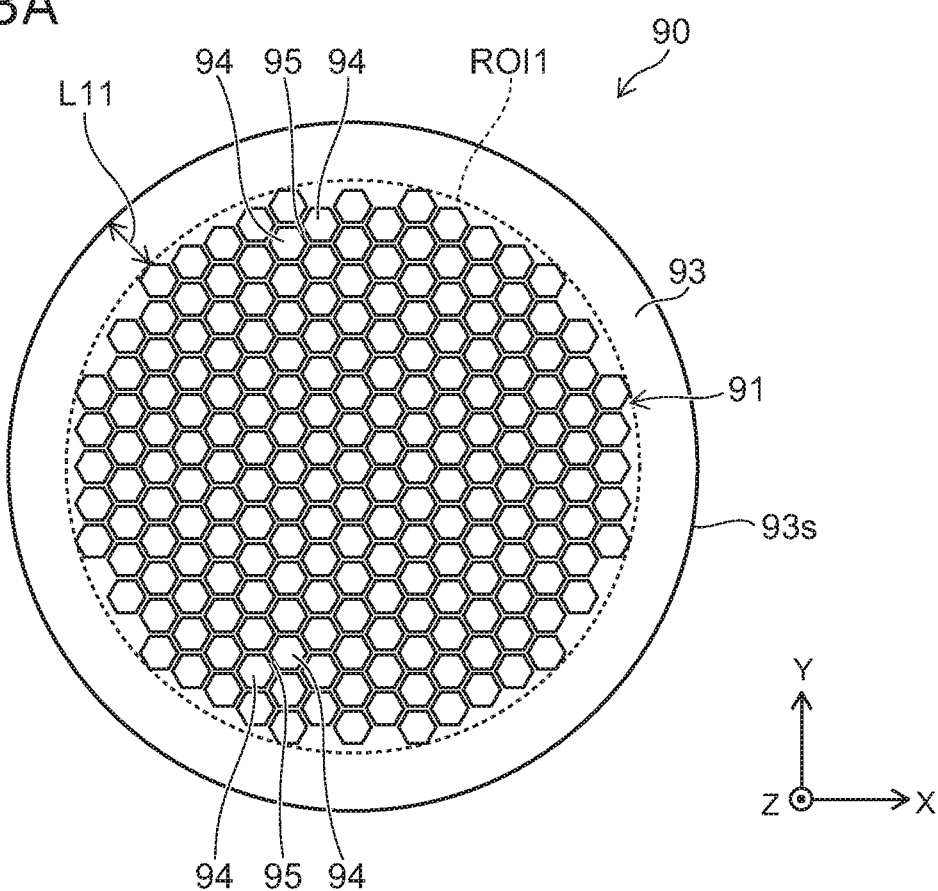
FIGS. 3A and 3B are schematic views illustrating a porous part of the electrostatic chuck according to the embodiment.
Figure 3B:
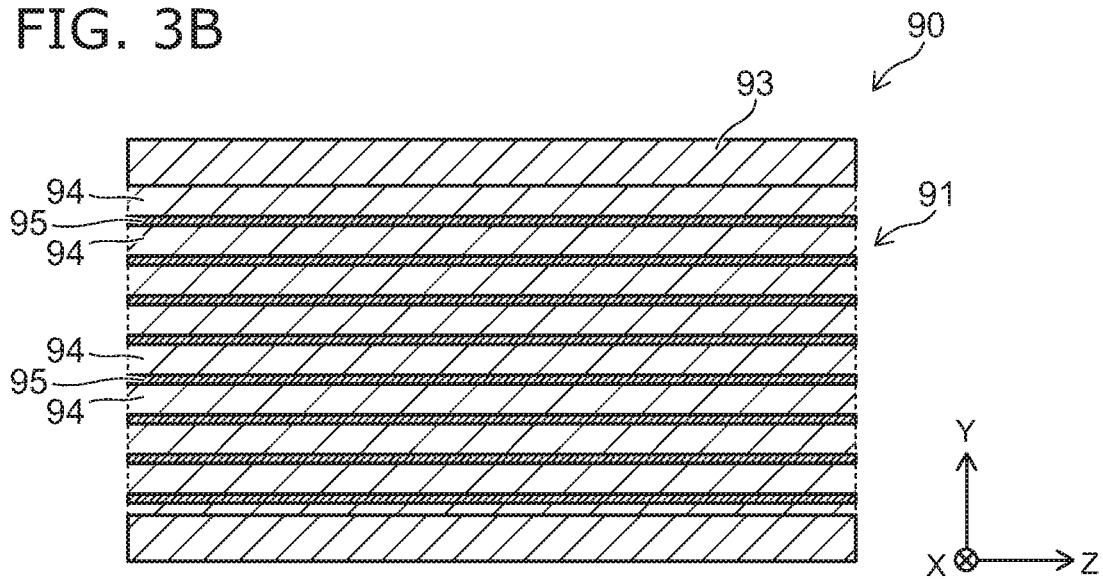

FIGS. 3A and 3B are schematic views illustrating the first porous part of the electrostatic chuck according to the embodiment.

FIG. 3A is a plan view of the first porous part 90 as viewed along the Z-direction. FIG. 3B is a sectional view taken along Z-Y plane of the porous part 90.

As shown in FIG. 3A and FIG. 3B, in the porous part 90, the porous region 91 includes a plurality of sparse portions 94 (one example of a first sparse portion and a second sparse portion) and a dense portion 95 (one example of a first dense portion and a second dense portion). The porous part 90 may include a plurality of dense portions 95. Each of the plurality of sparse portions 94 includes a plurality of pores 96. The dense portion 95 is denser than the sparse portion 94. That is, the dense portion 95 is a portion including fewer pores than the sparse portion 94, or a portion including substantially no pores. The dimension of the dense portion 95 in the X-direction or the Y-direction is smaller than the dimension of the dense region 93 in the X-direction or the Y-direction. The porosity of the dense portion 95 is lower than the porosity of the sparse portion 94. Thus, the density of the dense portion 95 is higher than the density of the sparse portion 94. The porosity of the dense portion 95 may be equal to the porosity of the dense region 93. The dense portion 95 is denser than the sparse portion 94. Thus, the rigidity of the dense portion 95 is higher than the rigidity of the sparse portion 94.

The porosity of one sparse portion 94 is e.g. the proportion that the volume of the space (pores 96) included in that sparse portion 94 occupies in the total volume of that sparse portion 94. The porosity of the dense portion 95 is e.g. the proportion that the volume of the space (pores 96) included in the dense portion 95 occupies in the total volume of the dense portion 95. For instance, the porosity of the sparse portion 94 is not less than 20% and not more than 60%, and preferably not less than 30% and not more than 50%. The porosity of the dense portion 95 is not less than 0% and not more than 5%.

Each of the plurality of sparse portions 94 extends in the Z-direction. For instance, each of the plurality of sparse portions 94 is shaped like a column (e.g. circular column or polygonal column) and provided so as to penetrate through the porous region 91 in the Z-direction. The dense portion 95 is located between the plurality of sparse portions 94. The dense portion 95 is shaped like a wall partitioning between the sparse portions 94 neighboring each other. As shown in FIG. 3A, as projected on a plane (XY-plane) perpendicular to the Z-direction, the dense portion 95 is provided so as to surround the outer periphery of each of the plurality of sparse portions 94. The dense portion 95 is continuous with the dense region 93 at the outer periphery of the porous region 91.

The number of sparse portions 94 provided in the porous region 91 is e.g. not less than 50 and not more than 1000. As shown in FIG. 3A, as projected on a plane (XY-plane) perpendicular to the Z-direction, the plurality of sparse portions 94 have a size generally equal to each other. For instance, as projected on a plane (XY-plane) perpendicular to the Z-direction, the plurality of sparse portions 94 are dispersed isotropically and uniformly in the porous region 91. For instance, the distance between the neighboring sparse portions 94 (i.e. the thickness of the dense portion 95) is generally constant.

For instance, as projected on a plane (XY-plane) perpendicular to the Z-direction, the distance L11 between the side surface 93s of the dense region 93 and the sparse portion 94 of the plurality of sparse portions 94 nearest to the side surface 93s is not less than 100 μm and not more than 1000 μm.

Thus, by providing a plurality of sparse portions 94, and a dense portion 95 denser than the sparse portion 94 in the porous region 91, the rigidity of the porous part 90 can be improved while ensuring resistance to arc discharge and the flow rate of the gas flowing in the through hole 15 compared with the case where a plurality of pores are dispersed randomly in three dimensions in the porous region.

For instance, the increase of the porosity of the porous region 91 results in increasing the flow rate of gas, but decreasing arc discharge resistance and rigidity. In contrast, by providing the dense portion 95 in the porous region 91, which has a smaller dimension in the X-direction or the Y-direction than a dimension of the dense region 93 in the X-direction or the Y-direction, the decrease of arc discharge resistance and rigidity can be suppressed even when the porosity is increased.

For instance, as projected on a plane (XY-plane) perpendicular to the Z-direction, suppose a minimum circle, ellipse, or polygon containing all the plurality of sparse portions 94. The inside of the circle, ellipse, or polygon can be regarded as the porous region 91. The outside of the circle, ellipse, or polygon can be regarded as the dense region 93.

As described above, the porous part 90 can include a plurality of sparse portions 94 and a dense portion 95. The plurality of sparse portions 94 include a plurality of pores 96 including a first pore 96 and a second pore 96. The dense portion 95 has a higher density than the sparse portion 94. Each of the plurality of sparse portions 94 extends in the Z-direction. The dense portion 95 is positioned between the plurality of sparse portions 94. The sparse portion 94 includes a wall part 97 (one example of a first wall part, a second wall part) provided between the plurality of pores 96 (between the first pore 96 and the second pore 96). In the X-direction or the Y-direction, the minimum dimension of the wall part 97 can be made smaller than the minimum dimension of the dense portion 95. Thus, the first porous part 90 is provided with the sparse portions 94 and the dense portion 95 extending in the Z-direction. This can improve the mechanical strength (rigidity) of the first porous part 90 while ensuring arc discharge resistance and gas flow rate.

Figure 5:
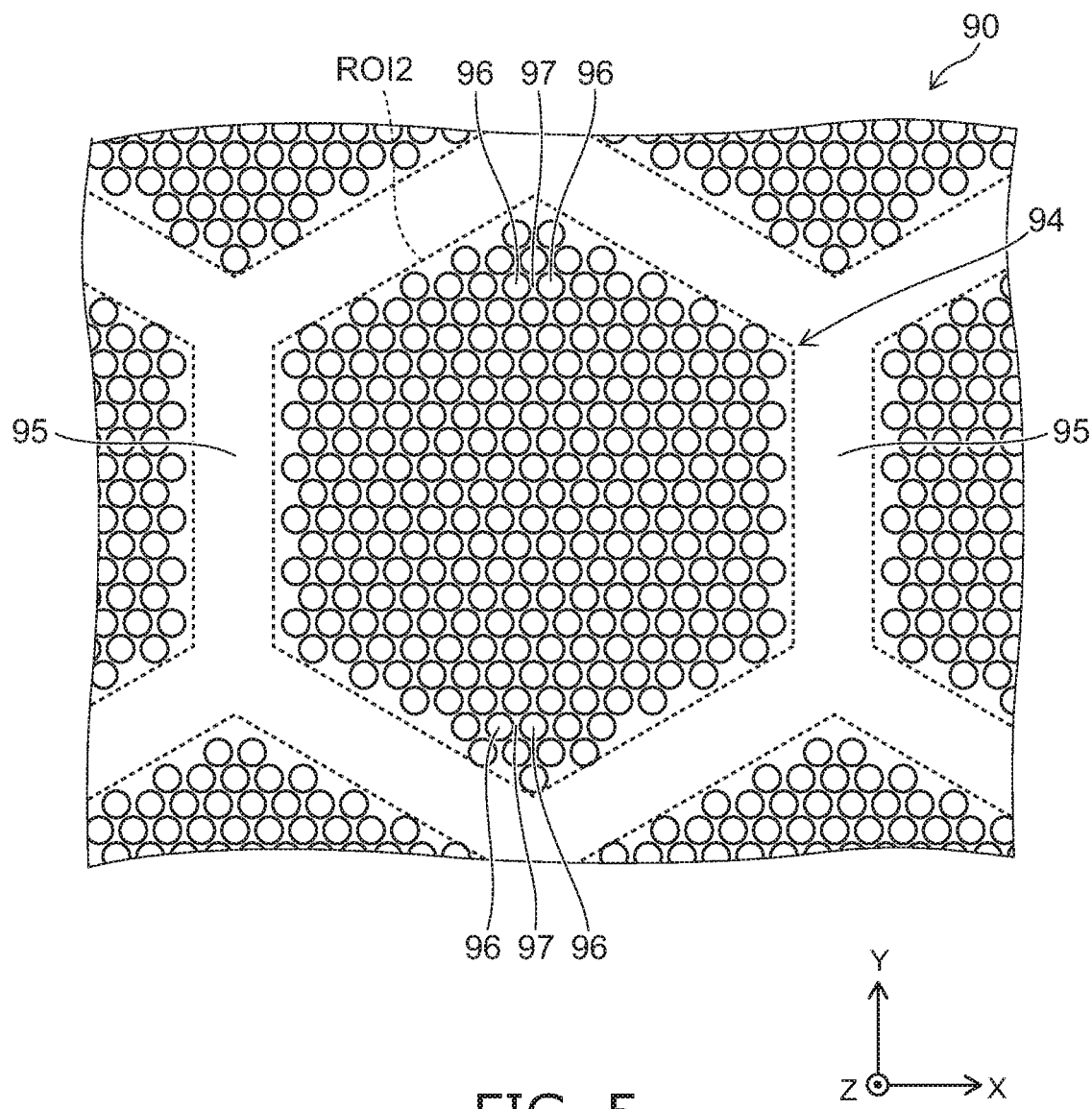
FIG. 5 is a schematic plan view illustrating the porous part of the electrostatic chuck according to the embodiment.

As illustrated in FIG. 5 described later, in the X-direction or the Y-direction, the dimension of the plurality of pores 96 provided in each of the plurality of sparse portions 94 can be made smaller than the dimension of the dense portion 95. Thus, the dimension of the plurality of pores 96 can be made sufficiently small. This can further improve resistance to arc discharge.

The aspect ratio of the plurality of pores 96 provided in each of the plurality of sparse portions 94 can be set to not less than 30 and not more than 10000. This can further improve resistance to arc discharge. More preferably, the lower limit of the aspect ratio of the plurality of pores 96 is 100 or more, and the upper limit is 1600 or less.

In the X-direction or the Y-direction, the dimension of the plurality of pores 96 provided in each of the plurality of sparse portions 94 can be set to not less than 1 micrometer and not more than 20 micrometers. Thus, the pores 96 having a pore dimension of 1-20 micrometers and extending in one direction can be arranged. This can achieve high resistance to arc discharge.

Figure 6A:
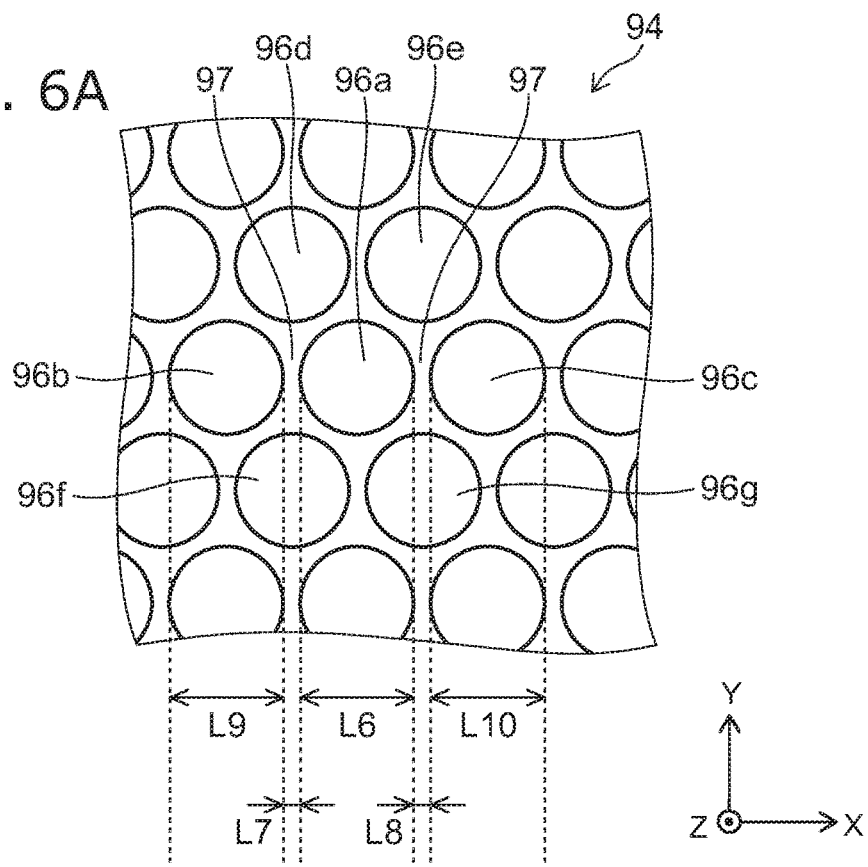
FIGS. 6A and 6B are schematic plan views illustrating the porous part of the electrostatic chuck according to the embodiment.
Figure 6B:
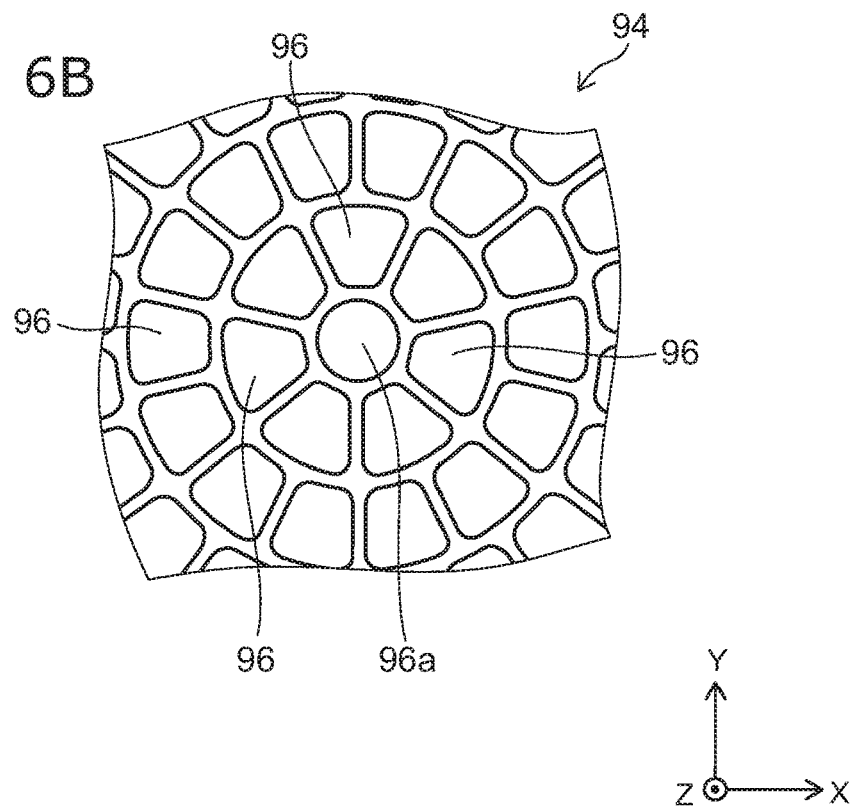

As shown in FIGS. 6A and 6B described later, as projected on a plane (XY-plane) perpendicular to the Z-direction, a pore 96a is positioned in a central part of the sparse portion 94. Among the plurality of pores 96, the number of pores 96b-96g neighboring the pore 96a and surrounding the pore 96a can be set to 6. Thus, in a plan view, a plurality of pores 96 can be arranged with high isotropy and high density. This can improve the rigidity of the porous part 90 while ensuring arc discharge resistance and gas flow rate.

Figure 4:
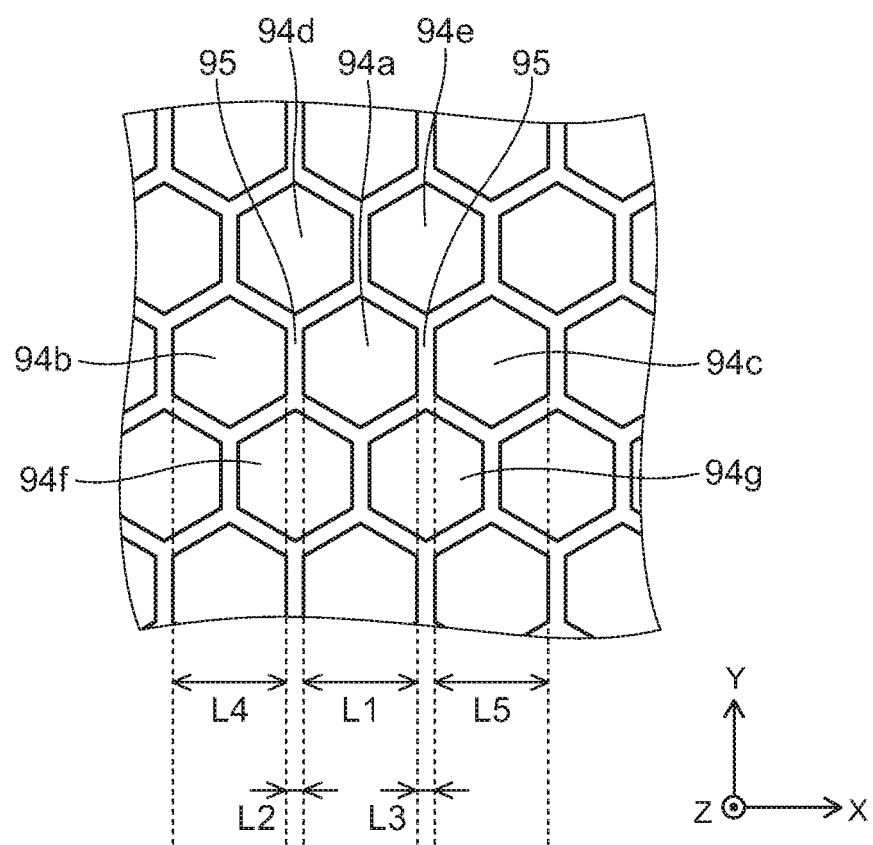
FIG. 4 is a schematic plan view illustrating the porous part of the electrostatic chuck according to the embodiment.

FIG. 4 is a schematic plan view illustrating the porous part 90 of the electrostatic chuck according to the embodiment.

FIG. 4 shows a part of the porous part 90 as viewed along the Z-direction, and corresponds to an enlarged view of FIG. 3A.

As projected on a plane (XY-plane) perpendicular to the Z-direction, each of the plurality of sparse portions 94 is generally shaped like a hexagon (shaped like a generally regular hexagon). As projected on a plane (XY-plane) perpendicular to the Z-direction, the plurality of sparse portions 94 include a sparse portion 94a positioned at a center of the porous region 91 and six sparse portions 94 (second to seventh sparse portions 94b-94g) surrounding the sparse portion 94a.

The sparse portions 94b-94g neighbor the first sparse portion 94a. The sparse portions 94b-94g are provided to be nearest to sparse portions 94a of the plurality of sparse portions 94.

The sparse portion 94b and the sparse portion 94c are juxtaposed with the sparse portion 94a in the X-direction. That is, the sparse portion 94a is positioned between the sparse portion 94b and the sparse portion 94c.

The length L1 along the X-direction of the sparse portion 94a (the diameter of the sparse portion 94a) is longer than the length L2 along the X-direction between the sparse portion 94a and the sparse portion 94b, and longer than the length L3 along the X-direction between the sparse portion 94a and the sparse portion 94c.

Each of the length L2 and the length L3 corresponds to the thickness of the dense portion 95. That is, the length L2 is the length along the X-direction of the dense portion 95 between the sparse portion 94a and the sparse portion 94b. The length L3 is the length along the X-direction of the dense portion 95 between the sparse portion 94a and the sparse portion 94c. The length L2 and the length L3 can be generally equal. For instance, the length L2 can be not less than 0.5 times and not more than 2.0 times of the length L3.

The length L1 can be generally equal to the length L4 along the X-direction of the sparse portion 94b (the diameter of the sparse portion 94b). The length L1 can be generally equal to the length L5 along the X-direction of the sparse portion 94c (the diameter of the sparse portion 94c). For instance, each of the length L4 and the length L5 can be not less than 0.5 times and not more than 2.0 times of the length L1.

Thus, the sparse portion 94a neighbors and is surrounded with six sparse portions 94 of the plurality of sparse portions 94. That is, as projected on a plane (XY-plane) perpendicular to the Z-direction, in the central part of the porous region 91, the number of sparse portions 94 neighboring one sparse portion 94 is 6. Thus, in a plan view, a plurality of sparse portions 94 can be arranged with high isotropy and high density. This can improve the rigidity of the porous part 90 while ensuring arc discharge resistance and the flow rate of the gas flowing in the through hole 15. This can also suppress variation in arc discharge resistance, variation in the flow rate of the gas flowing in the through hole 15, and variation in the rigidity of the porous part 90.

The diameter of the sparse portion 94 (e.g. length L1, L4, or L5) is e.g. not less than 50 μm and not more than 500 μm. The thickness of the dense portion 95 (e.g. length L2 or L3) is e.g. not less than 10 μm and not more than 100 μm. The diameter of the sparse portion 94 is larger than the thickness of the dense portion 95. As described previously, the thickness of the dense portion 95 is thinner than the thickness of the dense region 93.

FIG. 5 is a schematic plan view illustrating the porous part of the electrostatic chuck according to the embodiment.

FIG. 5 shows a part of the porous part 90 as viewed along the Z-direction. FIG. 5 is an enlarged view of the circumference of one sparse portion 94.

As shown in FIG. 5, in this example, the sparse portion 94 includes a plurality of pores 96 and a wall part 97 provided between the plurality of pores 96.

Each of the plurality of pores 96 extends in the Z-direction. Each of the plurality of pores 96 is shaped like a capillary extending in one direction (one-dimensional capillary structure), and penetrates through the sparse portion 94 in the Z-direction. The wall part 97 is shaped like a wall partitioning the pores 96 adjacent each other. As shown in FIG. 5, as projected on a plane (XY-plane) perpendicular to the Z-direction, the wall part 97 is provided so as to surround the outer periphery of each of the plurality of pores 96. The wall part 97 is continuous with the dense portion 95 at the outer periphery of the sparse portion 94.

The number of pores 96 provided in one sparse portion 94 is e.g. not less than 50 and not more than 1000. As shown in FIG. 5, as projected on a plane (XY-plane) perpendicular to the Z-direction, the plurality of pores 96 have a size generally equal to each other. For instance, as projected on a plane (XY-plane) perpendicular to the Z-direction, the plurality of pores 96 are dispersed isotropically and uniformly in the sparse portion 94. For instance, the distance between the adjacent pores 96 (i.e. the thickness of the wall part 97) is generally constant.

Thus, the pores 96 extending in one direction are arranged in the sparse portion 94. This can achieve high resistance to arc discharge with small variation compared with the case where a plurality of pores are dispersed randomly in three dimensions in the sparse portion.

Here, the "capillary structure" of the plurality of pores 96 is further described.

In recent years, for the purpose of high integration of semiconductor devices, the circuit line width is growing narrower, and the circuit pitch is growing finer. The electrostatic chuck is subjected to higher power. The temperature control of the target W is desired at higher level. Against this background, it is desired to ensure sufficient gas flow rate and to control the flow rate with high accuracy while reliably suppressing arc discharge in high-power environment. The electrostatic chuck 110 according to the embodiment includes a ceramic plug (porous part 90). The ceramic plug is conventionally provided to prevent arc discharge in the helium supply port (gas feed channel 53). In the embodiment, the pore diameter (the diameter of the pore 96) of the ceramic plug is decreased to the level of e.g. several to several ten μm (the details of the diameter of the pore 96 will be described later). The diameter decreased to this level may make it difficult to control the flow rate of gas. Thus, in the invention, for instance, the shape of the pore 96 is further devised so as to lie along the Z-direction. Specifically, in the conventional art, the flow rate is ensured using a relatively large pore, and its shape is made three-dimensionally complex to achieve prevention of arc discharge. In contrast, in the invention, the dimension of the pore 96 is made finer to the level of e.g. several to several ten μm to achieve prevention of arc discharge. Conversely, its shape is simplified to ensure flow rate. That is, the invention has been conceived based on the idea totally different from the conventional art.

The shape of the sparse portion 94 is not limited to the hexagon, but may be a circle (or ellipse) or other polygons. For instance, as projected on a plane (XY-plane) perpendicular to the Z-direction, suppose a minimum circle, ellipse, or polygon containing all the plurality of pores 96 arranged with a pitch of 10 μm or less. The inside of the circle, ellipse, or polygon can be regarded as the sparse portion 94. The outside of the circle, ellipse, or polygon can be regarded as the dense portion 95.

FIGS. 6A and 6B are schematic plan views illustrating the porous part 90 of the electrostatic chuck according to the embodiment.

FIGS. 6A and 6B show a part of the porous part 90 as viewed along the Z-direction, and are enlarged views showing the pores 96 in one sparse portion 94.

As shown in FIG. 6A, as projected on a plane (XY-plane) perpendicular to the Z-direction, the plurality of pores 96 include a pore 96*a* positioned in the central part of the sparse portion 94, and six pores 96 (pores 96*b*-96*g*) surrounding the pore 96*a*. The pores 96*b*-96*g* are adjacent to the pore 96*a*. The pores 96*b*-96*g* are pores 96 of the plurality of pores 96 nearest to the pore 96*a*.

The pore 96*b* and the pore 96*c* are aligned with the pore 96*a* in the X-direction. That is, the pore 96*a* is positioned between the pore 96*b* and the pore 96*c*.

For instance, the length L6 along the X-direction of the pore 96*a* (the diameter of the pore 96*a*) is longer than the length L7 along the X-direction between the pore 96*a* and the pore 96*b*, and longer than the length L8 along the X-direction between the pore 96*a* and the pore 96*c*.

Each of the length L7 and the length L8 corresponds to the thickness of the wall part 97. That is, the length L7 is the length along the X-direction of the wall part 97 between the pore 96*a* and the pore 96*b*. The length L8 is the length along the X-direction of the wall part 97 between the pore 96*a* and the pore 96*c*. The length L7 and the length L8 can be generally equal. For instance, the length L7 can be not less than 0.5 times and not more than 2.0 times of the length L8.

The length L6 can be generally equal to the length L9 along the X-direction of the pore 96*b* (the diameter of the pore 96*b*). The length L6 can be generally equal to the length L10 along the X-direction of the pore 96*c* (the diameter of the pore 96*c*). For instance, each of the length L9 and the length L10 can be not less than 0.5 times and not more than 2.0 times of the length L6.

For instance, when the diameter of the pore is small, arc discharge resistance and rigidity are improved. On the other hand, when the diameter of the pore is large, the flow rate of gas can be increased. The diameter of the pore 96 (e.g. length L6, L9, or L10) is e.g. not less than 1 micrometer (μrn) and not more than 20 μm. Thus, pores having a diameter of 1-20 micrometers and extending in one direction are arranged. This can achieve high resistance to arc discharge with small variation. More preferably, the diameter of the pore 96 is not less than 3 μm and not more than 10 μm.

Here, a method for measuring the diameter of the pore 96 is described. A scanning electron microscope (e.g. Hitachi High-Technologies, S-3000) is used to capture an image with a magnification of 1000 times or more. Commercially available image analysis software is used to calculate 100 circle-equivalent diameters for pores 96. Their average value is used as the diameter of the pore 96.

It is more preferable to suppress variation in the diameter of the plurality of pores 96. By decreasing variation in the diameter, the flow rate of the flowing gas and the breakdown voltage can be controlled more precisely. The variation in the diameter of the plurality of pores 96 can be based on the cumulative distribution of the 100 circle-equivalent diameters obtained in the above calculation of the diameter of the pore 96. Specifically, the concept of particle diameter D50 (median diameter) for the cumulative distribution 50 vol % and particle diameter D90 for the cumulative distribution 90 vol % are applied. These are generally used in granularity distribution measurement. The cumulative distribution graph for the pores 96 is produced in which the horizontal axis represents pore diameter (μm) and the vertical axis represents relative pore amount (%). This graph is used to determine the pore diameter for the cumulative distribution 50 vol % (corresponding to D50 diameter) and the pore diameter for the cumulative distribution 90 vol % (corresponding to D90 diameter). Preferably, the variation in the diameter of the plurality of pores 96 is suppressed so as to satisfy the relation D50:D90≤1:2.

The thickness of the wall part 97 (e.g. length L7 or L8) is e.g. not less than 1 μm and not more than 10 μm. The thickness of the wall part 97 is thinner than the thickness of the dense portion 95.

Thus, the first pore 96a is adjacent and surrounded with six pores 96 of the plurality of pores 96. That is, as projected on a plane (XY-plane) perpendicular to the Z-direction, in the central part of the sparse portion 94, the number of pores 96 neighboring one pore 96 is 6. Thus, in plan view, a plurality of pores 96 can be arranged with high isotropy and high density. This can improve the rigidity of the porous part 90 while ensuring arc discharge resistance and the flow rate of the gas flowing in the through hole 15. This can also suppress variation in arc discharge resistance, variation in the flow rate of the gas flowing in the through hole 15, and variation in the rigidity of the first porous part 90.

FIG. 6B shows another example of the arrangement of the plurality of pores 96 in the sparse portion 94. As shown in FIG. 6B, in this example, the plurality of pores 96 are arranged concentrically about the first pore 96a. Thus, as projected on a plane (XY-plane) perpendicular to the Z-direction, a plurality of pores can be arranged with high isotropy and high density.

Each of the lengths L0-L10 can be measured by observation using a microscope such as a scanning electron microscope.

The evaluation of porosity in the specification is described. In the description, the evaluation of porosity in the porous part 90 is taken as an example.

An image like the plan view of FIG. 3A is captured. Image analysis is used to calculate the proportion R1 of the plurality of sparse portions 94 occupied in the porous region 91. The image is captured using a scanning electron microscope (e.g. Hitachi High-Technologies, S-3000). A BSE image is captured at an acceleration voltage of 15 kV and a magnification of 30 times. For instance, the image size is 1280×960 pixels, and the image gray scale assumes 256 levels.

The proportion R1 of the plurality of sparse portions 94 occupied in the porous region 91 is calculated using image analysis software (e.g. Win-ROOF Ver. 6.5 (Mitani Corporation)).

Calculation of the proportion R1 using Win-ROOF Ver. 6.5 can be performed as follows.

The evaluation range ROI1 (see FIG. 3A) is set to the minimum circle (or ellipse) including all the sparse portions 94.

Binarization by a single threshold (e.g. 0) is performed to calculate the area S1 of the evaluation range ROI1.

Binarization by two thresholds (e.g. 0 and 136) is performed to calculate the total area S2 of the plurality of sparse portions 94 in the evaluation range ROI1. At this time, filling in the sparse portions 94 and deletion of regions having a small area regarded as noise (threshold being 0.002 or less) are performed. The two thresholds are appropriately adjusted by the brightness and contrast of the image.

The proportion R1 is calculated as the proportion of the area S2 to the area 51. That is, the proportion R1 is given by proportion R1 (%)=(area S2)/(area S1)×100.

In the embodiment, the proportion R1 of the plurality of sparse portions 94 occupied in the porous region 91 is e.g. not less than 40% and not more than 70%, and preferably not less than 50% and not more than 70%. The proportion R1 is e.g. approximately 60%.

An image like the plan view of FIG. 5 is captured. Image analysis is used to calculate the proportion R2 of the plurality of pores 96 occupied in the sparse portion 94. The proportion R2 corresponds to e.g. the porosity of the sparse portion 94. The image is captured using a scanning electron microscope (e.g. Hitachi High-Technologies, S-3000). A BSE image is captured at an acceleration voltage of 15 kV and a magnification of 600 times. For instance, the image size is 1280×960 pixels, and the image gray scale assumes 256 levels.

The proportion R2 of the plurality of pores 96 occupied in the sparse portion 94 is calculated using image analysis software (e.g. Win-ROOFc Ver. 6.5 (Mitani Corporation)).

Calculation of the proportion R2 using Win-ROOF Ver. 6.5 can be performed as follows.

The evaluation range R0I2 (see FIG. 5) is set to a hexagon approximating the shape of the sparse portion 94. The evaluation range R0I2 includes all the pores 96 provided in one sparse portion 94.

Binarization by a single threshold (e.g. 0) is performed to calculate the area S3 of the evaluation range R0I2.

Binarization by two thresholds (e.g. 0 and 96) is performed to calculate the total area S4 of the plurality of pores 96 in the evaluation range R0I2. At this time, filling in the pores 96 and deletion of regions having a small area regarded as noise (threshold being 1 or less) are performed. The two thresholds are appropriately adjusted by the brightness and contrast of the image.

The proportion R2 is calculated as the proportion of the area S4 to the area S3. That is, the proportion R2 is given by proportion R2 (%)=(area S4)/(area S3)×100.

In the embodiment, the proportion R2 of the plurality of pores 96 occupied in the sparse portion 94 (the porosity of the sparse portion 94) is e.g. not less than 20% and not more than 60%, and preferably not less than 30% and not more than 50%. The proportion R2 is e.g. approximately 40%.

The porosity of the porous region 91 corresponds to e.g. the product of the proportion R1 of the plurality of sparse portions 94 occupied in the porous region 91 and the proportion R2 of the plurality of pores 96 occupied in the sparse portion 94. For instance, when the proportion R1 is 60% and the proportion R2 is 40%, the porosity of the porous region 91 can be calculated as approximately 24%.

Thus, the porous part 90 includes a porous region 91 having the porosity as described above. This can improve breakdown voltage while ensuring the flow rate of the gas flowing in the through hole 15.

Likewise, the porosity of the ceramic dielectric substrate 11 and the porous part 70 can be calculated. Preferably, the magnification of the scanning electron microscope is appropriately selected within the range of several ten times to several thousand times depending on the observation target.

Figure 7A:
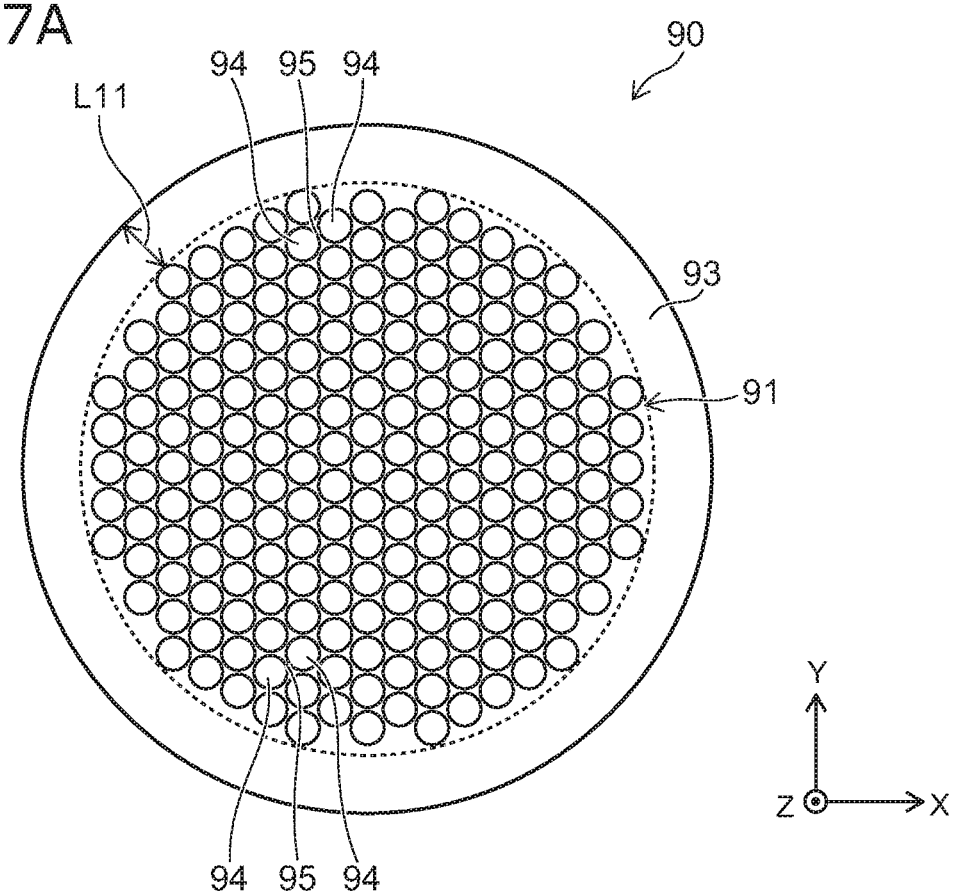
FIGS. 7A and 7B are schematic views illustrating a first porous part 90 according to the other embodiment.
Figure 7B:
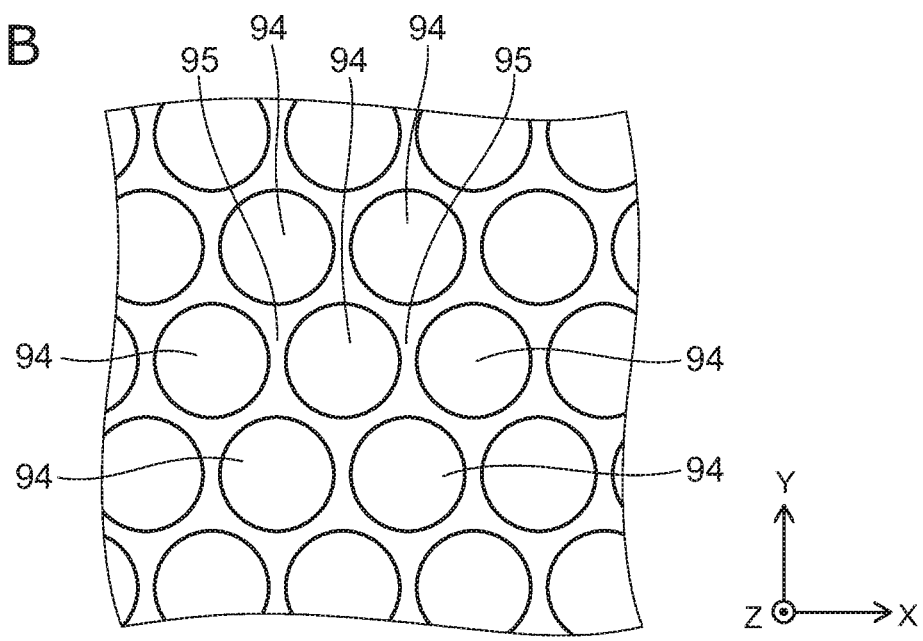

FIGS. 7A and 7B are schematic views illustrating an alternative porous part 90 according to the embodiment.

FIG. 7A is a plan view of the porous part 90 as viewed along the Z-direction. FIG. 7B corresponds to an enlarged view of part of FIG. 7A.

As shown in FIGS. 7A and 7B, in this example, the planar shape of the sparse portion 94 is circular. Thus, the planar shape of the sparse portion 94 does not need to be hexagonal.

Figure 8:
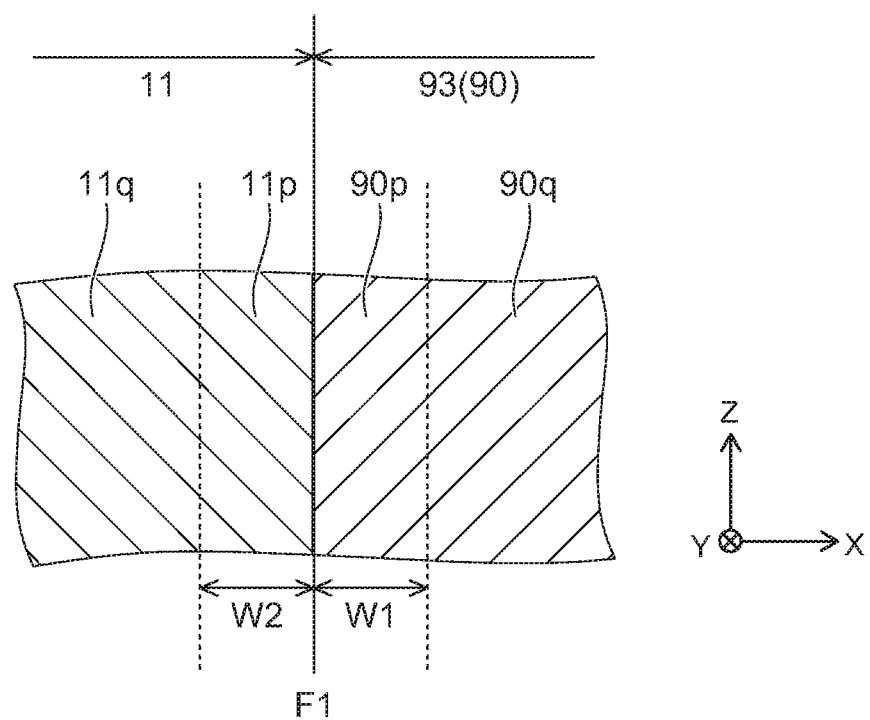
FIG. 8 is a schematic sectional view illustrating the electrostatic chuck according to the embodiment.

FIG. 8 is a schematic sectional view illustrating the electrostatic chuck according to the embodiment.

FIG. 8 corresponds to an enlarged view of region B shown in FIG. 2. That is, FIG. 8 shows the neighborhood of the interface F1 between the porous part 90 (dense region 93) and the ceramic dielectric substrate 11. In this example, the material of the porous part 90 and the ceramic dielectric substrate 11 is aluminum oxide.

As shown in FIG. 8, the porous part 90 includes a first region 90p located on the ceramic dielectric substrate 11 side in the X-direction or the Y-direction, and a second region 90q continuous with the first region 90p in the X-direction or the Y-direction. The first region 90p and the second region 90q are part of the dense region 93 of the first porous part 90.

The first region 90p is located between the second region 90q and the ceramic dielectric substrate 11 in the X-direction or the Y-direction. The first region 90p is a region of approximately 40-60 μm in the X-direction or the Y-direction from the interface F1. That is, the width W1 along the X-direction or the Y-direction of the first region 90p (the length of the first region 90p in the direction perpendicular to the interface F1) is e.g. not less than 40 μm and not more than 60 μm.

The ceramic dielectric substrate 11 includes a first substrate region 11p located on the porous part 90 (first region 90p) side in the X-direction or the Y-direction, and a second substrate region 11q continuous with the first substrate region 11p in the X-direction or the Y-direction. The first region 90p and the first substrate region 11p are provided in contact with each other. The first substrate region 11p is located between the second substrate region 11q and the porous part 90 in the X-direction or the Y-direction. The first substrate region 11p is a region of approximately 40-60 μm in the X-direction or the Y-direction from the interface F1. That is, the width W2 along the X-direction or the Y-direction of the first substrate region 11p (the length of the first substrate region 11p in the direction perpendicular to the interface F1) is e.g. not less than 40 μm and not more than 60 μm.

Figure 9A:
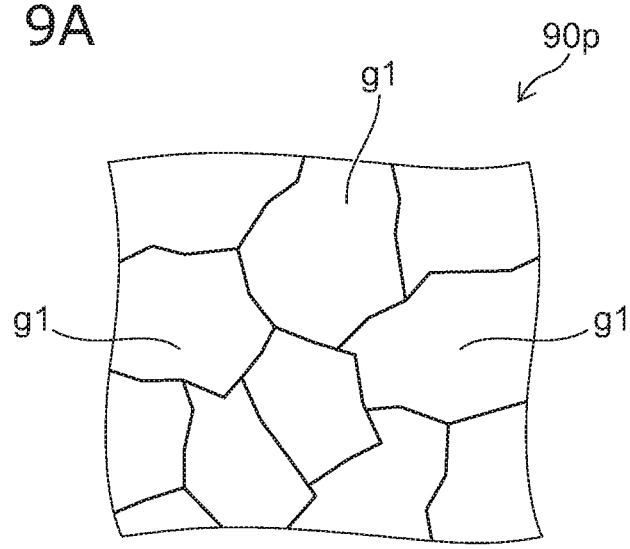
FIGS. 9A and 9B are schematic sectional views illustrating the electrostatic chuck according to the embodiment.
Figure 9B:
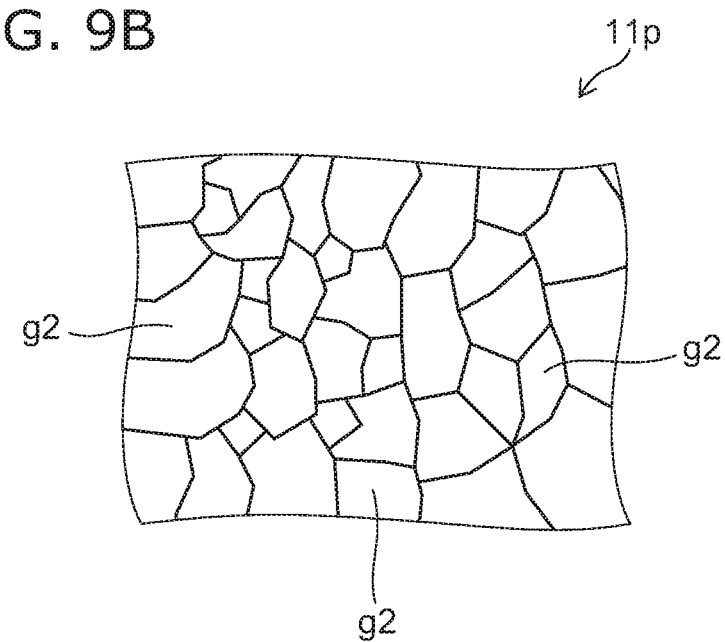

FIGS. 9A and 9B are schematic sectional views illustrating the electrostatic chuck according to the embodiment.

FIG. 9A is an enlarged view of part of the first region 90p shown in FIG. 8. FIG. 9B is an enlarged view of part of the first substrate region 11p shown in FIG. 8.

As shown in FIG. 9A, the first region 90p includes a plurality of grains g1 (crystal grains). As shown in FIG. 9B, the first substrate region 11p includes a plurality of grains g2 (crystal grains).

The average grain size in the first region 90p (the average value of the diameter of the plurality of grains g1) is different from the average grain size in the first substrate region 11p (the average value of the diameter of the plurality of grains g2).

Thus, the average grain size in the first region 90p is different from the average grain size in the first substrate region 11p. This can improve the coupling strength (interfacial strength) between the crystal grain of the porous part 90 and the crystal grain of the ceramic dielectric substrate 11 at the interface F1. For instance, this can suppress peeling of the porous part 90 from the ceramic dielectric substrate 11 and removal of crystal grains.

The average grain size can be the average value of the circle-equivalent diameter of the crystal grain in the cross-sectional image as shown in FIG. 9A and FIG. 9B. The circle-equivalent diameter is the diameter of a circle having an area equal to the area of the target planar shape.

Preferably, the ceramic dielectric substrate 11 and the porous part 90 are integrated with each other. The porous part 90 is fixed to the ceramic dielectric substrate 11 by integration with the ceramic dielectric substrate 11. This can improve the strength of the electrostatic chuck compared with the case of fixing the porous part 90 to the ceramic dielectric substrate 11 with e.g. adhesive. For instance, this can suppress the degradation of the electrostatic chuck due to e.g. corrosion or erosion of adhesive.

In this example, the average grain size in the first substrate region 11p is smaller than the average grain size in the first region 90p. The small grain size in the first substrate region 11p can improve the coupling strength between the porous part 90 and the ceramic dielectric substrate at the interface between the porous part 90 and the ceramic dielectric substrate. The small grain size in the first substrate region can increase the strength of the ceramic dielectric substrate 11 and suppress the risk of e.g. cracks due to stress produced during manufacturing or processing. For instance, the average grain size in the first region 90p is not less than 3 μm and not more than 5 μm. For instance, the average grain size in the first substrate region 11p is not less than 0.5 μm and not more than 2 μm. The average grain size in the first substrate region 11p is not less than 1.1 times and not more than 5 times of the average grain size in the first region 90p.

For instance, the average grain size in the first substrate region 11p is smaller than the average grain size in the second substrate region 11q. In the first substrate region 11p provided in contact with the first region 90p, preferably, the interfacial strength with the first region 90p is increased by interaction such as diffusion with the first region 90p. On the other hand, in the second substrate region 11q, preferably, the material of the ceramic dielectric substrate 11 develops its intrinsic characteristics. Thus, the average grain size in the first substrate region 11p is made smaller than the average grain size in the second substrate region 11q. Accordingly, ensuring the interfacial strength in the first substrate region 11p can be made compatible with the characteristics of the ceramic dielectric substrate 11 in the second substrate region 11q.

The average grain size in the first region 90p may be smaller than the average grain size in the first substrate region 11p. This can improve the coupling strength between the porous part 90 and the ceramic dielectric substrate at the interface between the porous part 90 and the ceramic dielectric substrate. The small grain size in the first region 90p increases the strength of the porous part 90. This can suppress removal of grains during processing and reduce particles.

Similarly to the foregoing, the average grain size in the first region 90p can be made smaller than the average grain size in the second substrate region 11q. This can improve mechanical strength in the first region 90p.

Referring again to FIG. 2A, the structure of the electrostatic chuck 110 is further described. The electrostatic chuck 110 may further include a porous part 70 (a first porous part, a second porous part) as described previously. The porous part 70 does not include the plurality of sparse portions 94 and the plurality of dense portions 95 described in FIGS. 3 to 7. In this example, the porous part 70 is provided in the base plate and disposed to oppose the gas feed channel 53. The porous part 70 can be provided between the porous part 90 and the gas feed channel 53 in the Z-direction, for instance. For instance, the porous part 70 is fitted into the ceramic dielectric substrate 11 side of the base plate 50. As illustrated in FIG. 2A, for instance, a countersink part 53a is provided on the ceramic dielectric substrate 11 side of the base plate 50. The countersink part 53a is provided like a cylinder. The porous part 70 is fitted into the countersink part 53a by appropriately designing the inner diameter of the countersink part 53a. As described later, the porous part 70 may be provided in the ceramic dielectric substrate 11.

In this example, the upper surface 70U of the porous part 70 is exposed to the upper surface 50U of the base plate 50. The upper surface 70U of the porous part 70 is opposed to the lower surface 90L of the porous part 90. In this example, a space SP is formed between the upper surface 70U of the porous part 70 and the lower surface 90L of the porous part 90. The first porous part can be any one of the porous part 90 and the porous part 70.

The porous part 70 includes a porous region 71 including a plurality of pores (an example of a first porous region and a second porous region) and a dense region 72 (an example of a first dense region and a second dense region) denser than the porous region 71. The porous region 71 is provided like a cylinder (e.g. circular cylinder) and fitted into the countersink part 53a. The shape of the porous part 70 is preferably a circular cylinder, but is not limited to a circular cylinder. The porous part 70 is made of an insulative material. The material of the porous part 70 is e.g. $Al_2O_3$, $Y_2O_3$, $ZrO_2$, MgO, SiC, AlN, or $Si_3N_4$. The material of the porous part 70 may be glass such as $SiO_2$. The material of the porous part 70 may be e.g. $Al_2O_3$—$TiO_2$, $Al_2O_3$—MgO, $Al_2O_3$—$SiO_2$, $Al_6O_{13}Si_2$, YAG, or $ZrSiO_4$.

The porosity of the porous region 71 is e.g. not less than 20% and not more than 60%. The density of the porous region 71 is e.g. not less than 1.5 g/cm$^3$ and not more than 3.0 g/cm$^3$. The gas such as He flowing from the gas feed channel 53 passes through a plurality of pores of the porous region 71 and is fed from the through hole 15 provided in the ceramic dielectric substrate 11 to the groove 14.

The porous region 72 includes, for instance, a portion made of a ceramic insulating film. The ceramic insulating film is provided between the porous region 71 and the gas feed channel 53. The ceramic insulating film 72 is denser than the porous region 71. The porosity of the ceramic insulating film is e.g. 10% or less. The density of the ceramic insulating film is e.g. not less than 3.0 g/cm$^3$ and not more than 4.0 g/cm$^3$. The ceramic insulating film is provided on the side surface of the porous part 70.

The material of the ceramic insulating film is e.g. $Al_2O_3$, $Y_2O_3$, $ZrO_2$, or MgO. The material of the ceramic insulating film may be e.g. $Al_2O_3$—$TiO_2$, $Al_2O_3$—MgO, $Al_2O_3$—$SiO_2$, $Al_6O_{13}Si_2$, YAG, or $ZrSiO_4$.

The ceramic insulating film can be formed by e.g. thermal spraying, PVD (physical vapor deposition), CVD, sol-gel method, or aerosol deposition method on the side surface of the porous part 70. The film thickness of the film thickness is e.g. not less than 0.05 mm and not more than 0.5 mm.

The porosity of the ceramic dielectric substrate 11 is e.g. 1% or less. The density of the ceramic dielectric substrate 11 is e.g. 4.2 g/cm$^3$.

The porosity in the ceramic dielectric substrate 11 and the porous part 70 is measured by a scanning electron microscope as described above. The density is measured based on JIS C 2141 5.4.3.

The porous part 70 is fitted in the countersink part 53a of the gas feed channel 53. Then, the ceramic insulating film 72 is in contact with the base plate 50. That is, the porous part 70 including the porous region 71 and the dense region 73 having high insulation performance is interposed between the through hole 15 for guiding the gas such as He to the groove 14 and the metallic base plate 50. Use of such a porous part 70 can achieve higher insulation performance than in the case where only the porous region 71 is provided in the gas feed channel 53.

The plurality of pores 71p provided in the porous part 70 are further dispersed in three dimensions than the plurality of pores 96 provided in the porous part 90. The proportion of pores penetrating in the Z-direction can be made higher in the porous part 90 than in the porous part 70. A higher breakdown voltage can be obtained by providing the porous part 70 including the plurality of pores 71p dispersed in three dimensions. This can suppress the occurrence of arc discharge effectively while smoothing the flow of the gas. The flow of gas can be smoothed by providing the first porous part 90 having a high proportion of pores penetrating in the Z-direction. As shown in FIG. 2A, by providing the porous part 90 having a high proportion of pores penetrating in the Z-direction in the ceramic dielectric substrate 11, the occurrence of arc discharge can be more effectively suppressed, for instance, even if a plasma density is high.

The average value of the plurality of pores provided in the porous part (the second porous part, the porous part 70 in FIG. 2A) provided in the base plate 50 can be made larger than the average value of the plurality of pores provided in the porous part (the first porous part, the porous part 90 in FIG. 2A) provided in the ceramic dielectric substrate 11. Thus, the porous part having a large pore diameter is provided on the gas feed channel 53 side. This can smooth the flow of gas. The porous part 90 having a small pore diameter is provided on the suction target side. This can suppress the occurrence of arc discharge more effectively.

In the example where the porous part 70 is provided in the base plate 50 and the porous part 90 is provided in the ceramic dielectric substrate 11, the average value of the diameter of the plurality of pores 71p provided in the porous part 70 can be made larger than the average value of the diameter of the plurality of pores 96 provided in the porous part 90. Thus, the porous part 70 having a large diameter of the pore is provided. This can smooth the flow of the gas. The porous part 90 having a small diameter of the pore is provided on the suction target side. This can suppress the occurrence of arc discharge more effectively.

Variation in the diameter of the plurality of pores can be decreased. This can suppress arc discharge more effectively.

Figure 10:
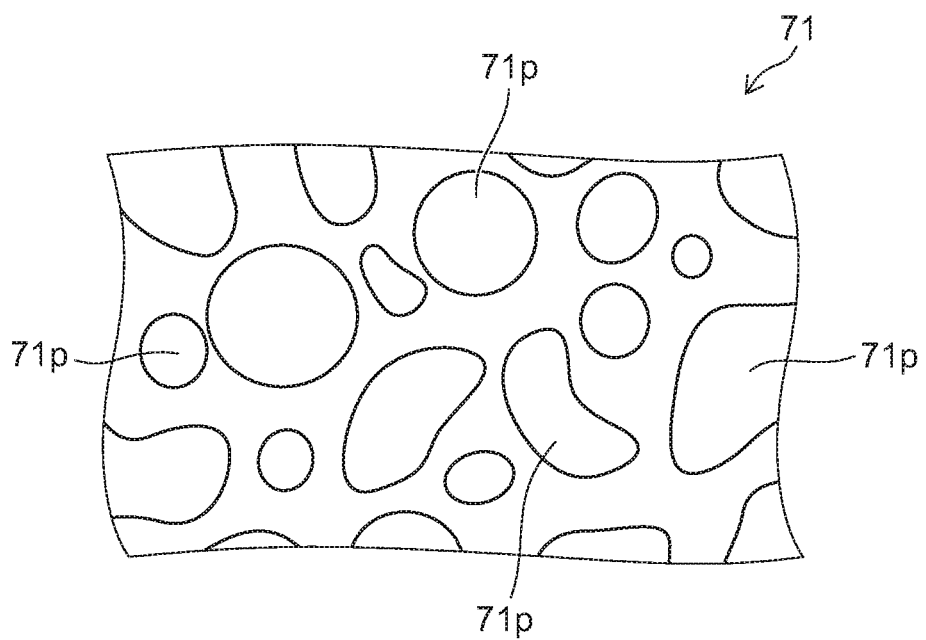
FIG. 10 is a schematic sectional view illustrating the porous part of the electrostatic chuck according to the embodiment.

FIG. 10 is a schematic sectional view illustrating the porous part 70 of the electrostatic chuck according to the embodiment.

FIG. 10 is an enlarged view of a part of the cross section of the porous region 71.

The plurality of pores 71p provided in the porous region 71 are dispersed in three dimensions in the X-direction, the Y-direction, and the Z-direction inside the porous region 71. In other words, the porous region 71 has a three-dimensional network structure in which the pores 71p spread in the X-direction, the Y-direction, and the Z-direction. The plurality of pores 71p are dispersed in the porous region 71 e.g. randomly or uniformly in the porous part 70.

The plurality of pores 71p are dispersed in three dimensions. Thus, parts of the plurality of pores 71p are also exposed to the surface of the porous region 71. Accordingly, fine irregularities are formed at the surface of the porous region 71. That is, the surface of the porous region 71 can be roughened. The surface roughness of the porous region 71 can facilitate forming e.g. the ceramic insulating film (the dense region 72) on the surface of the porous region 71. For instance, this improves contact between the ceramic insulating film (the dense region 72) and the porous region 71. Peeling of the ceramic insulating film (the dense region 72) can be suppressed.

The average value of the diameter of the plurality of pores 71p provided in the porous region 71 is larger than the average value of the diameter of the plurality of pores 96 provided in the porous region 91. The diameter of the pore 71p is e.g. not less than 10 μm and not more than 50 μm. The porous region 91 having a small pore 96 diameter can control (limit) the flow rate of the gas flowing in the through hole 15. This can suppress variation in the gas flow rate caused by the porous region 71. The diameter of the pore 71p and the diameter of the pore 96 can be measured by a scanning electron microscope as described above.

FIG. 11 is a schematic sectional view illustrating a porous part 90 according to the other embodiment.

FIG. 11 illustrates the circumference of the porous part 90 as in FIG. 2A.

In this example, the porous part 90 is provided in the ceramic dielectric substrate 11. The porous part 70 is provided in the base plate 50. That is, the porous part 90 is used for the first porous part. The porous part 70 is used for the second porous part. The porous part 90 may be provided in both of the ceramic dielectric substrate 11 and the base plate 50.

In this example, a bonding member 61 (adhesive) is provided between the porous part 90 and the ceramic dielectric substrate 11. The porous part 90 is bonded to the ceramic dielectric substrate 11 with the bonding member 61. For instance, the bonding member 61 is provided between the side surface of the porous part 90 (the side surface 93s of the dense region 93) and the inner wall 15w of the through hole 15. The porous part 90 and the ceramic dielectric substrate 11 do not need to be in contact with each other.

The bonding member 61 is e.g. a silicone adhesive. The bonding member 61 is e.g. an elastic member having elasticity. The elastic modulus of the bonding member 61 is e.g. lower than the elastic modulus of the dense region 93 of the porous part 90, and lower than the elastic modulus of the ceramic dielectric substrate 11.

In the structure in which the porous part 90 and the ceramic dielectric substrate 11 are bonded by the bonding member 61, the bonding member 61 can be used as a cushioning material against the difference between the thermal contraction of the porous part 90 and the thermal contraction of the ceramic dielectric substrate 11.

Figure 12A:
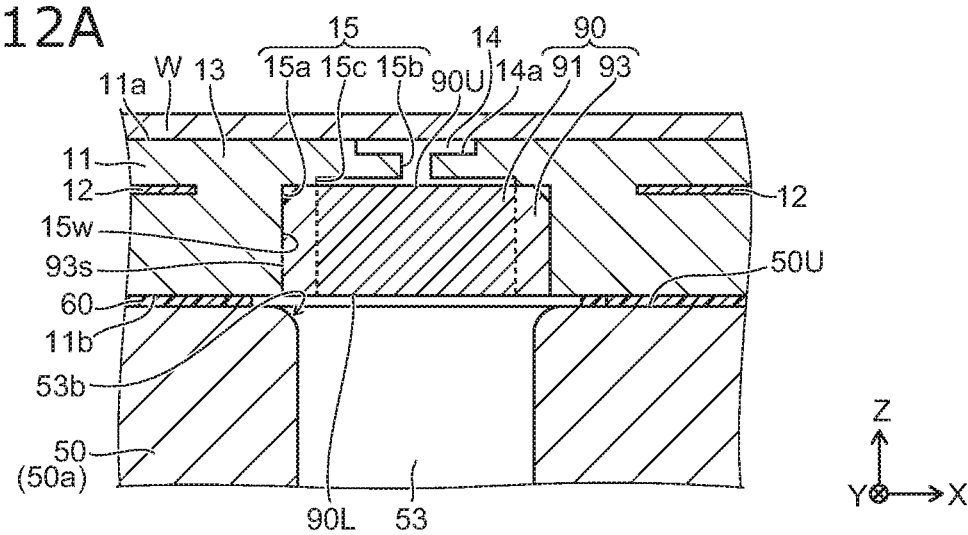
FIGS. 12A and 12B are schematic sectional views illustrating the porous part according to the other embodiment.
Figure 12B:
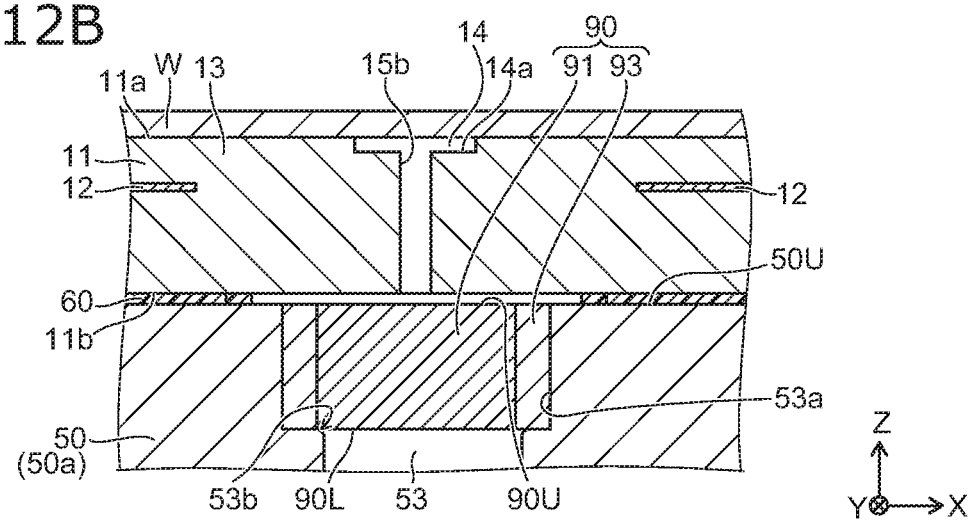

FIGS. 12A and 12B are schematic sectional views illustrating the porous part 90 according to the other embodiment.

In the embodiment described above (see FIG. 2), the porous par 90 is provided in the ceramic dielectric substrate 11, and the porous part 70 is provided in the base plate 50.

However, in the case where the porous part 90 is used, one the porous part provided in the base plate 50 or the porous part provided in the ceramic dielectric substrate 11 can be omitted.

For instance, in the example shown in FIG. 12A, the porous part 90 is provided in the ceramic dielectric substrate 11, and the gas feed channel 53 is provided in the base plate 50. This can reduce a flow path resistance of gas such as He e.g. supplied to the porous part 90.

In the example shown in FIG. 12B, the hole part 15b is provided in the ceramic dielectric substrate 11, and the porous part 90 is provided in base plate 50. This can reduce a flow path resistance of gas such as He e.g. supplied to the porous part 90.

As shown in FIG. 12A, at least a part of the edge 53b of the opening on the ceramic dielectric substrate side of the gas feed channel can be configured to be a curve. For instance, so called "R chamfer" can be made for the edge 53b of the opening of the gas feed channel 53. In this case, the edge 53b of the opening of the gas feed channel 53 can be configured to be a curve with a radius of about 0.2 millimeters (mm).

As described previously, the base plate 50 is formed of a metal such as aluminum. Therefore, when the edge of the opening of the gas feed channel 53 is sharp, the electric field concentration is easy to occur, and the arc discharge may easily occur.

In the embodiment, at least a part of the edge 53b of the opening of the gas feed channel 53 is configured to be a curved. This can suppress the electric field concentration, and further can reduce the arc discharge.

FIGS. 13A to 13D are schematic sectional views illustrating porous parts 90a, 70a according to the other embodiment.

FIGS. 14A to 14C are schematic sectional views illustrating porous parts 90a, 90b according to the other embodiment.

Figure 13A:
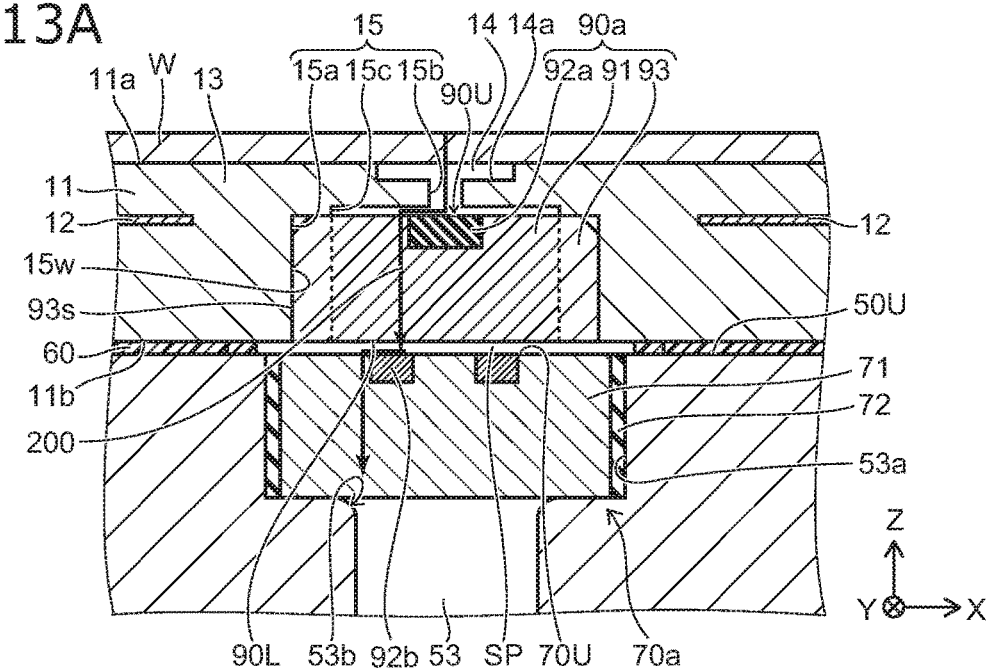
FIGS. 13A to 13D are schematic sectional views illustrating the porous parts according to the other embodiment.

FIG. 13A shows the example of the case where the ceramic dielectric substrate 11 is provided with the porous part 90a modified from the dense region 93 of the porous part 90, and the base plate 50 is provided with the porous part 70a modified from the dense region 72 of the porous part 70. FIG. 14A is the example of the case where the ceramic dielectric substrate 11 and the base plate 50 are provided with the porous part 90a modified from the dense region 93 of the porous part 90 and the porous part 70b modified from the dense region 72 of the porous part 70, respectively.

Figure 13B:
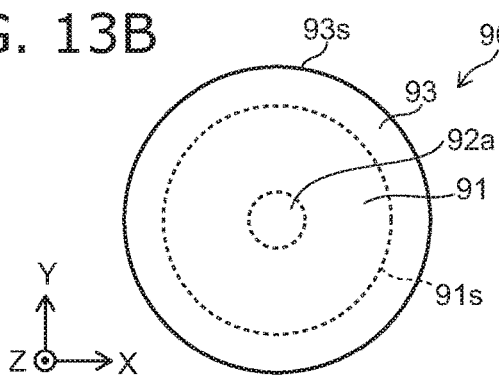

As shown in FIG. 13A, FIG. 13B, and FIG. 14A, in the porous part 90s provided in the ceramic dielectric substrate 11, the porous region 91 further includes a dense part 92a. That is, in the porous part 90a, the dense part 92a is further added to the porous part 90 described above.

As shown in FIG. 13A and FIG. 13B, the dense part 92a can present a plate shape (for instance, disk shape). As shown in FIG. 14A, the dense part 92a can also present a columnar shape (for instance, cylindrical shape). A material of the dense part 92a can be, for instance, similar to a material of the dense region 93 described above. The dense part 92a is denser than the porous region 91. The dense part 92a may have approximately same denseness as the dense region 93. As projected on a plane (XY-plane) perpendicular to the Z-direction, the dense part 92a overlaps the hole part 15b. It is preferable that the porous region 91 is configured not to overlap the hole part 15b. In such configuration, a generated current tries to flow around the dense part 92a. For that reason, a distance (conduction path) where the current flows can be longer, and thus an electron is not easy to be accelerated, and further the arc discharge can be suppressed from occurring. In the embodiment of FIGS. 13A-13B, the dense part 92a is embedded in and surrounded by the porous region 91, and is situated proximate a radially central portion of the porous part, as shown.

As projected on a plane (XY-plane) perpendicular to the Z-direction, it is preferable that the dimension of the dense part 92a is the same as the dimension of the hole part 15b, or the dimension of the dense part 92a is larger than the dimension of the hole part 15b. This can introduce the current which flows the interior of the hole part 15b into the dense part 92a. Thus, the distance (conduction path) where the current flows can be made long effectively.

In this example, as projected on a plane (XY-plane) perpendicular to the Z-direction, the porous region 91 is provided around the dense part 92a. While improving the resistance to the arc discharge by arranging the dense part 92a at a position opposing to the hole part 15b, the surrounding is the porous region 91, and thus sufficient gas flow can be ensured. That is, reducing the arc discharge and smoothing the gas flow can be compatible.

As shown in FIG. 13A, the length along the Z-direction of the dense part 92a may be smaller than the length along the Z-direction of the porous part 90a, and as shown in FIG. 14A, may be substantially the same as the length along the Z-direction of the porous part 90a. If the length along the Z-direction of the dense part 92a is made longer, the occurrence of arc discharge can be suppressed more effectively. If the length along the Z-direction of the dense part 92a is made smaller than the length along the Z-direction of the porous part 90a, the gas flow can be smoothed.

The dense part 92a may be configured by a dense body substantially not including pores, and if being denser than the porous region 91, the dense part 92a may be configured to include a plurality of pores. When the dense part 92a includes the plurality of pores, the diameter of the pores is preferably made smaller than the diameter of pores included in the porous region 91. Porosity (percent: %) of the dense part 92a can be lower than porosity (%) of the porous region 91. Thus, density (gram/cubic centimeter:g/cm$^3$) of the dense part 92a can be higher than density (g/cm$^3$) of the porous region 91. The porosity of the dense part 92a can be, for instance, the same as the porosity of the dense region 93 described above.

Here, arc discharge often occurs by a current flows from the ceramic dielectric substrate 11 side toward the base plate 50 side in the interior of the hole part 15b. Thus, if the dense part 92a with low porosity is provided near the hole part 15b, as shown in FIG. 13A and FIG. 14A, a current 200 tries to flow around the dense part 92a. For that reason, a distance (conduction path) where a current 200 flows can be made longer, and thus an electron is not easy to be accelerated, and further the arc discharge can be suppressed from occurring.

As shown in FIG. 13A, for instance, for the porous part 70 provided in the base plate 50, the porous part 70a including the porous region 71 further including a dense part 92b can be used. As shown in FIG. 14A, the porous part 90a can be provided in the ceramic dielectric substrate 11, and the porous part 70b can be also provided in the base pate 50. In the porous part 70b, the porous region 71 further includes the dense part 92b. That is, in the porous part 70b, the dense part 92b is further added to the porous part 70 described above.

That is, the dense part 92b can also be further added to the porous part 70 or the porous part 90 provided in the base plate 50.

Figure 13C:
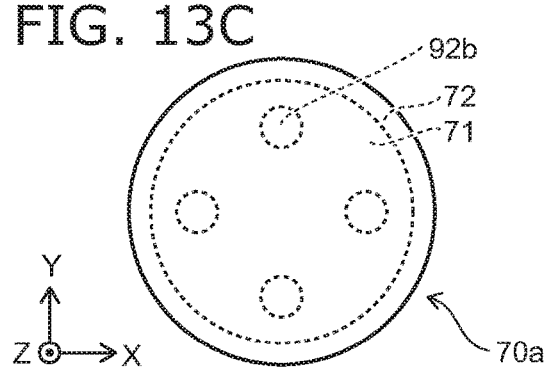
Figure 13D:
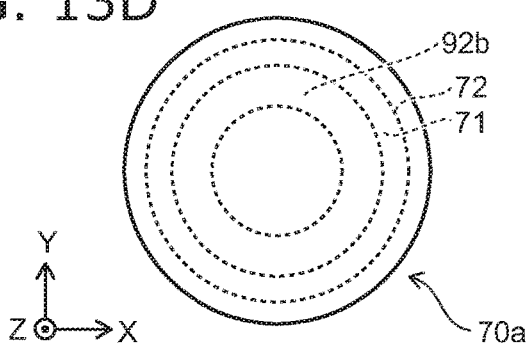

At least one dense part 92b can be provided. As shown in FIG. 13C and FIG. 14B, a plurality of dense parts 92b presenting a plate shape (for instance, disk shape) or a columnar shape (for instance, cylindrical column shape) can also be provided. As shown in FIG. 13D and FIG. 14C, the dense part 92b presenting a ring shape (for instance, circular ring shape) or a tube shape (for instance, cylindrical shape) can also be provided. A material, density, porosity e.g. of the dense part 92b can be the same as the dense part 92a.

As projected on a plane (XY-plane) perpendicular to the Z-direction, it is preferable that at least a part of the dese part (e.g. dense part 92b) included in the porous part provided in the base plate 50 overlaps the dense part (e.g. dense part 92a) included in the porous part provided in the ceramic dielectric substrate 11. In such configuration, for instance, when the current which flows around the dense part 92a in the porous part 90a (porous part on the ceramic dielectric substrate 11 side) flows through the porous parts 70, 90b (the porous part on the base plate 50 side) provided with the dense part 92b, the current does not flow in the porous regions (e.g. porous regions 71, 91) of the porous part provided on the base plate 50 side, and further tries to flow around the dense part 92b. For that reason, the distance (conduction path) where the current flows can be made longer, and thus an electron is not easy to be accelerated, and further arc discharge can be suppressed from occurring.

Figure 15A:
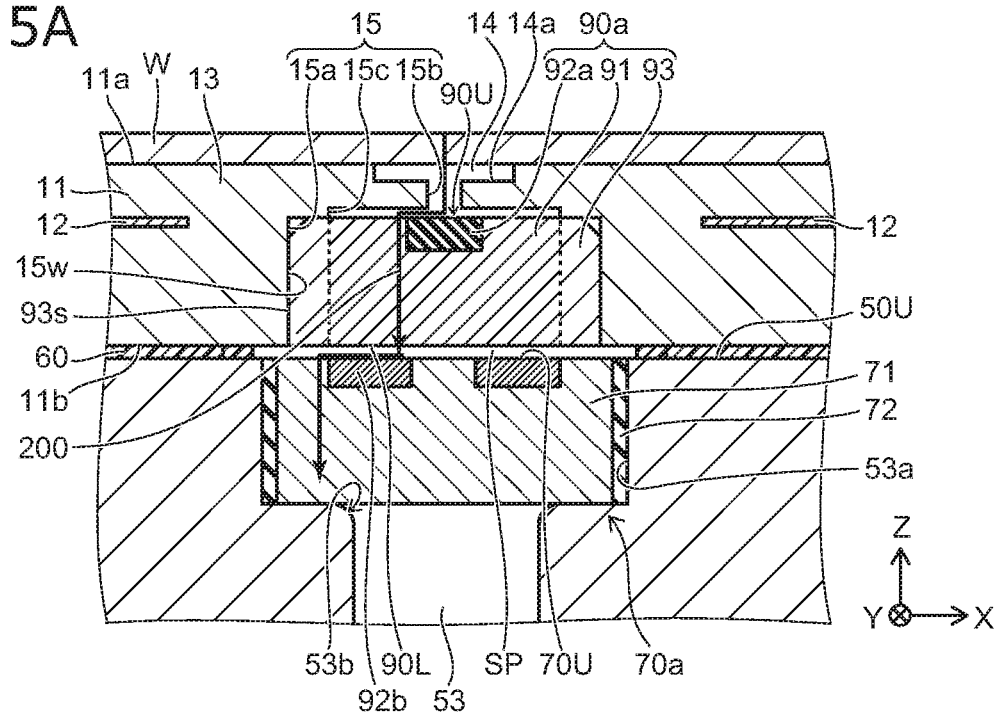
FIGS. 15A and 15B are schematic sectional views illustrating the porous parts according to the other embodiment.
Figure 15B:
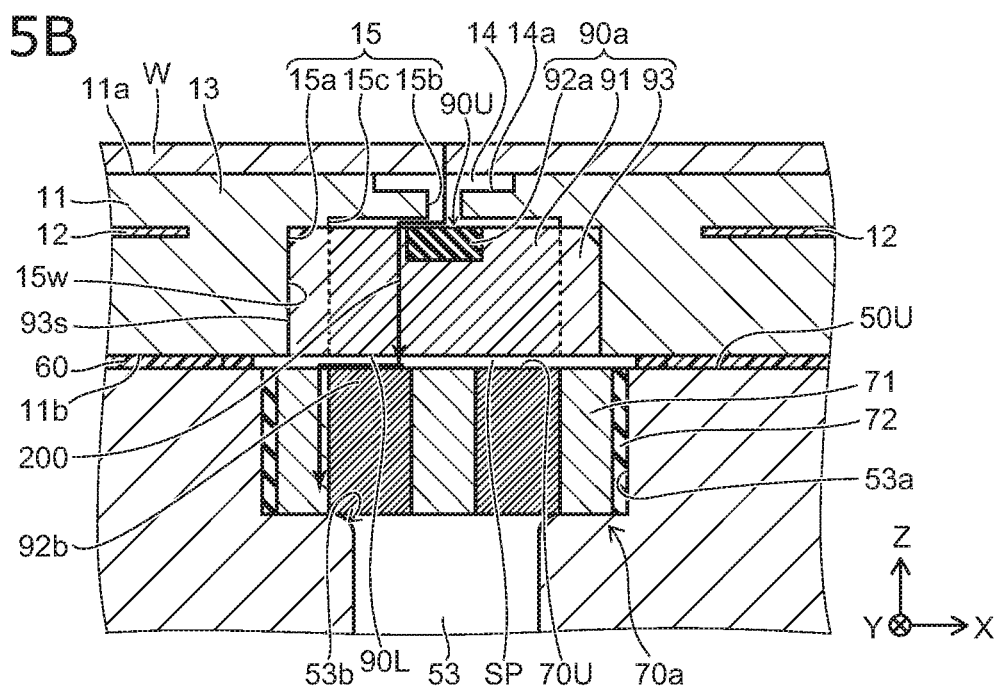

FIGS. 15A and 15B are schematic sectional views illustrating the porous part according to the other embodiment.

As shown in FIG. 14A, the porous part 90a can be provided in the ceramic dielectric substrate 11, and the porous part 70b can be also provided in the base pate 50. In the porous part 70b, the porous region 71 further includes the dense part 92b embedded in and surrounded by the porous region. That is, in the porous part 70b, the dense part 92b is further added to the porous part 70 described above.

In this way, the current which flows in the porous part 90a can be suppressed from flowing in the porous part 70a without through the dense part 92b. Thus, the distance (conduction path) where the current flows can be made longer effectively.

As shown in FIGS. 15A and 15B, as projected on a plane (XY-plane) perpendicular to the Z-direction, it is preferable that the dense part 92b overlap the dense region 93. As projected on a plane (XY-plane) perpendicular to the Z-direction, the dense part 92b may contact the dense region 93. In this way, the distance (conduction path) where the current flows can be made longer, and thus an electron is not easy to be accelerated, and further arc discharge can be suppressed from occurring.

Figure 16:
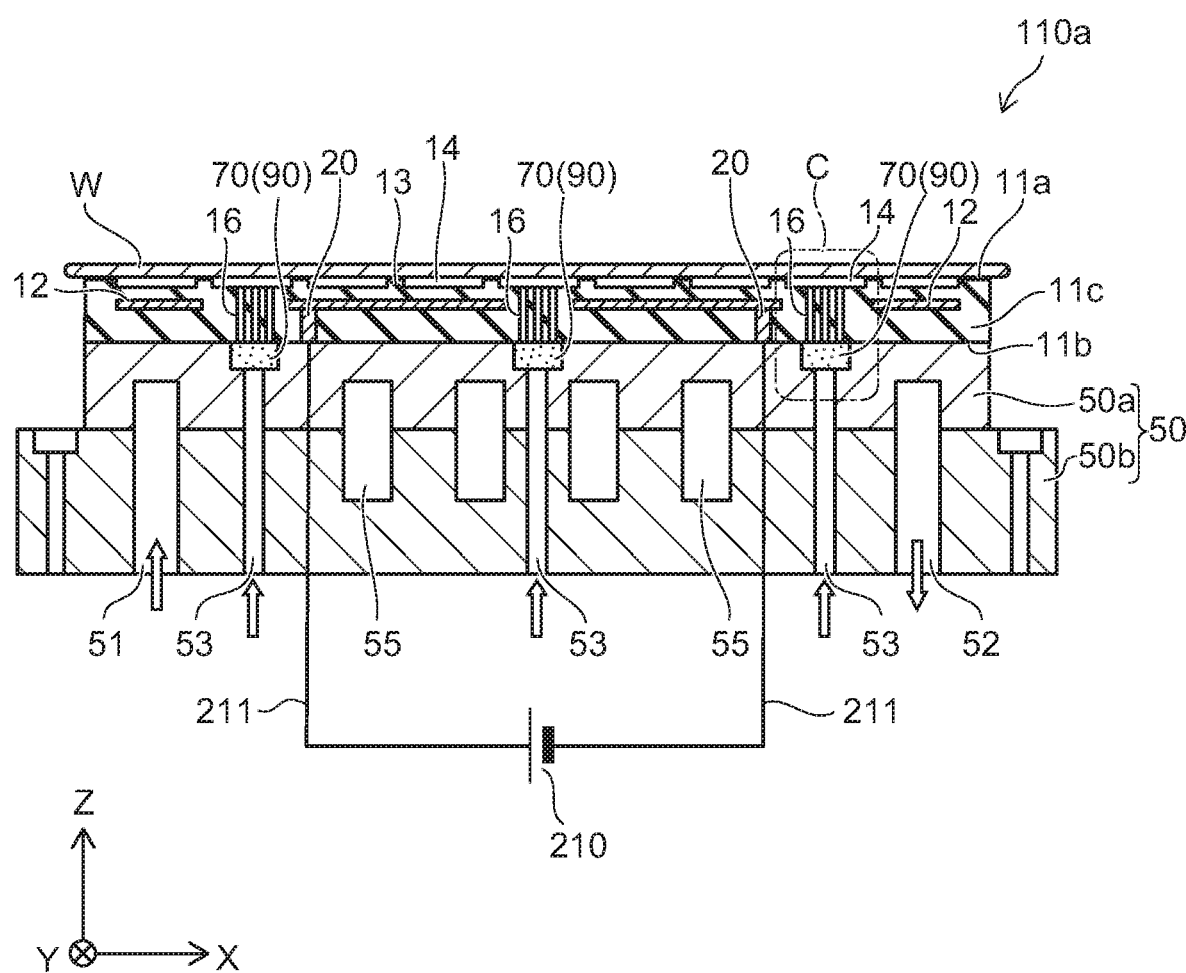
FIG. 16 is a schematic sectional view illustrating an electrostatic chuck according to the other embodiment.

FIG. 16 is a schematic sectional view illustrating an electrostatic chuck according to the other embodiment.

Figure 17A:
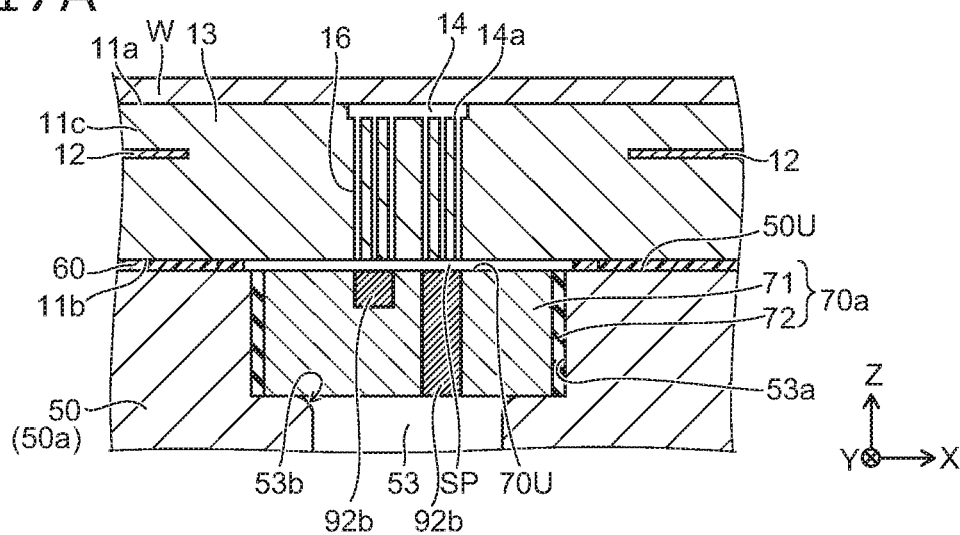
FIGS. 17A and 17B are enlarged views of the region C shown in FIG. 16.
Figure 17B:
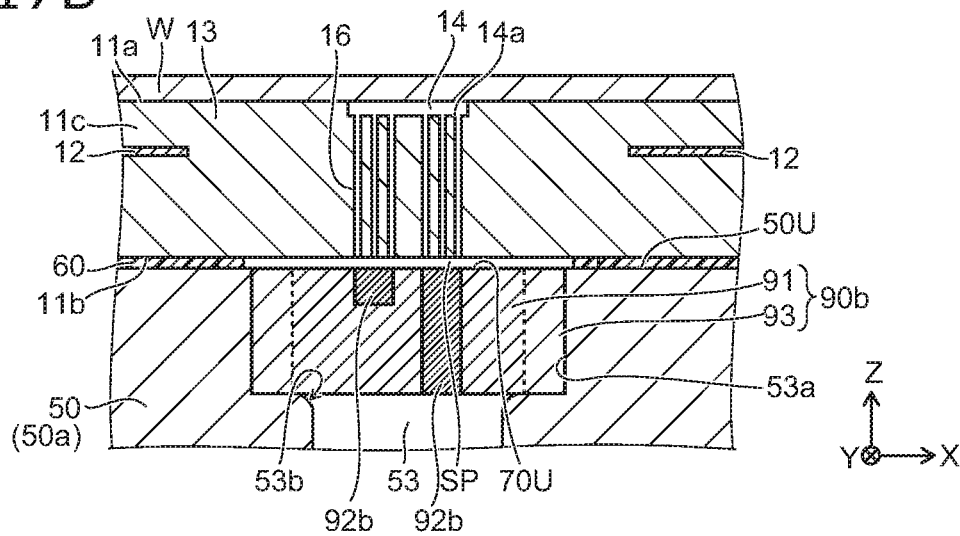

FIGS. 17A and 17B correspond to enlarged views of the region C shown in FIG. 16.

As shown in FIGS. 17A and 17B, an electrostatic chuck 110a includes a ceramic dielectric substrate 11c, and the base plate 50. That is, the ceramic dielectric substrate 11c is not provided with the porous part (porous part 70 or porous part 90). The ceramic dielectric substrate 11c is directly provided with a plurality of holes 16. The plurality of holes 16 can be formed in the ceramic dielectric substrate 11c, for instance, by laser irradiation or ultrasonic processing e.g. In this example, one end of the plurality of holes 16 is positioned on a surface 14a of the groove 14. Other end of the plurality of holes 16 is positioned on the second major surface 11b of the ceramic dielectric substrate 11c. That is, the plurality of holes 16 pierces the ceramic dielectric substrate 11c in the Z-direction.

As shown in FIGS. 17A and 17B, the base plate 50 can be provided with the porous part (e.g. porous part 70a). The base plate 50 may be provided with the porous part 90b. As illustrated in FIG. 12A, the base plate 50 may be provided with the gas feed channel 53 without being provided with the porous part 70 or the porous part 90.

As shown in FIGS. 17A and 17B, an upper surface 70U of the porous part 70 (or an upper surface 90U of the porous part 90) provided on the base plate 50 and the second major surface 11b of the ceramic dielectric substrate 11c may not contact. As before, at least a part of the edge 53b of the opening on the ceramic dielectric substrate 11c side of the gas feed channel 53 can be configured to be a curve.

If the plurality of holes 16 are provided in the ceramic dielectric substrate 11c, while ensuring the flow rate the gas supplied between a back of the target W placed on the electrostatic chuck 110a and the first major surface 11a including the groove 14, the resistance to arc discharge can be improved.

The length along the Z-direction of the dense part 92b can be smaller than the length along the Z-direction of the porous parts 70a, 90b. The length along the Z-direction of the dense part 92b can also be substantially the same as the length along the Z-direction of the porous parts 70a, 90b. If the length along the Z-direction of the dense part 92b is made short, the gas flow can be smoothed. The length along the Z-direction of the dense part 92b is made long, the occurrence of arc discharge can be suppressed more effectively.

As projected on a plane (XY-plane) perpendicular to the Z-direction, at least one of the plurality of holes 16 can be configured to overlap the dense part 92b. A material, density, porosity e.g. of the plurality of the dense parts 92b are as described above, for instance.

As shown in FIG. 17A, the porous part 70a including the plurality of dense parts 92b may be provided in the base plate 50. As shown in FIG. 17B, the porous part 90b including the plurality of dense parts 92b may be provided in the base plate 50.

Figure 18:
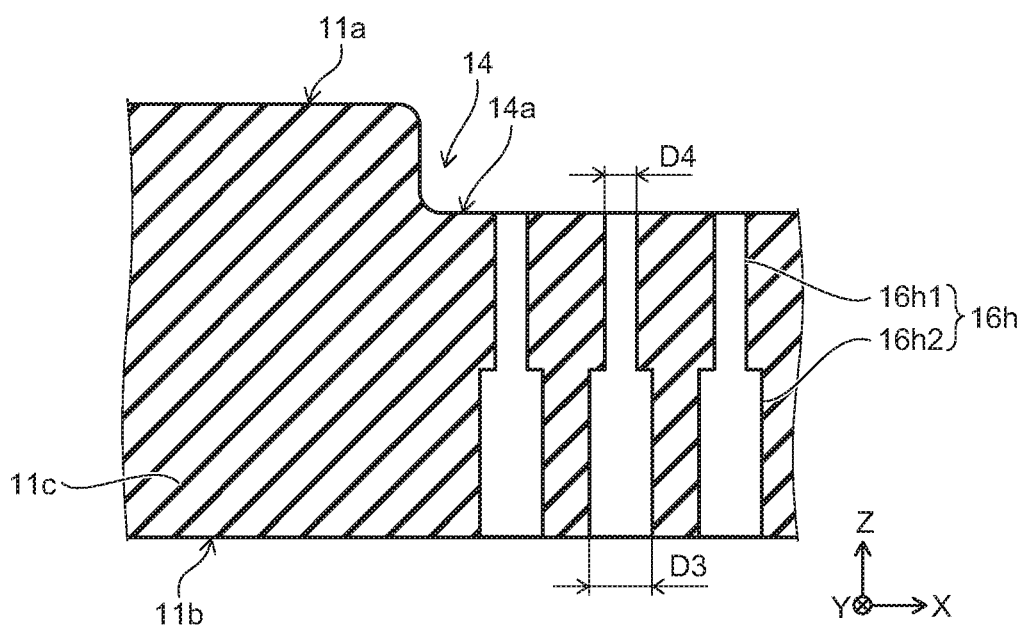
FIG. 18 is a schematic sectional view illustrating a plurality of holes according to the other embodiment.

FIG. 18 is a schematic sectional view illustrating a plurality of holes 16h according to the other embodiment.

The plurality of holes 16h can be formed in the ceramic dielectric substrate 11c by laser irradiation or ultrasonic processing.

As shown in FIG. 18, at least one of the plurality of holes 16h provided in the ceramic dielectric substrate 11c can include a first portion 16h1 opening to the groove 14 and a second portion 16h2 opening to the second major surface 11b. In the X-direction or the Y-direction, a dimension of the first portion 16h1 can be smaller than a dimension of the second portion 16h2. In the X-direction or the Y-direction, at least one of the plurality of holes 16h can be configured to have an opening dimension D4 on the surface 14a side of the groove 14 smaller than an opening dimension D3 on the base plate 50 side. In FIG. 18, the holes 16h having a stepped structure are illustrated, however the holes 16 can be configured to have a tapered structure. For instance, the opening dimension D4 can be 0.01 millimeters (mm)~0.1 millimeters (mm) in a diameter. For instance, the opening dimension D3 can be about 0.15 millimeters (mm)~0.2 millimeters (mm) in a diameter. If the opening dimension D4 is smaller than the opening dimension D3, the occurrence of arc discharge can be suppressed effectively.

An aspect ratio of the holes 16h can be, for instance, 3~60. In calculating the aspect ratio, "vertical" is taken, for instance, as a length in the Z-direction of the holes 16h in FIG. 18, and "horizontal" is taken as an average length of a length in the X-direction of the holes 16h in the upper surface (surface 14a) of the holes 16h and a length in the X-direction of the holes 16h in the lower surface (second major surface 11b) of the holes 16h. The measurement of the length in the X-direction of the holes 16h can be performed by using an optical microscopy, a digital microscope e.g. such as a laser microscopy and a factory microscopy e.g.

The opening dimension D4 can be smaller than a length L1 of the sparse portion 94a illustrated in FIG. 4 (a length L4 of the sparse portion 94b, a length L5 of the sparse portion 94c).

Figure 19A:
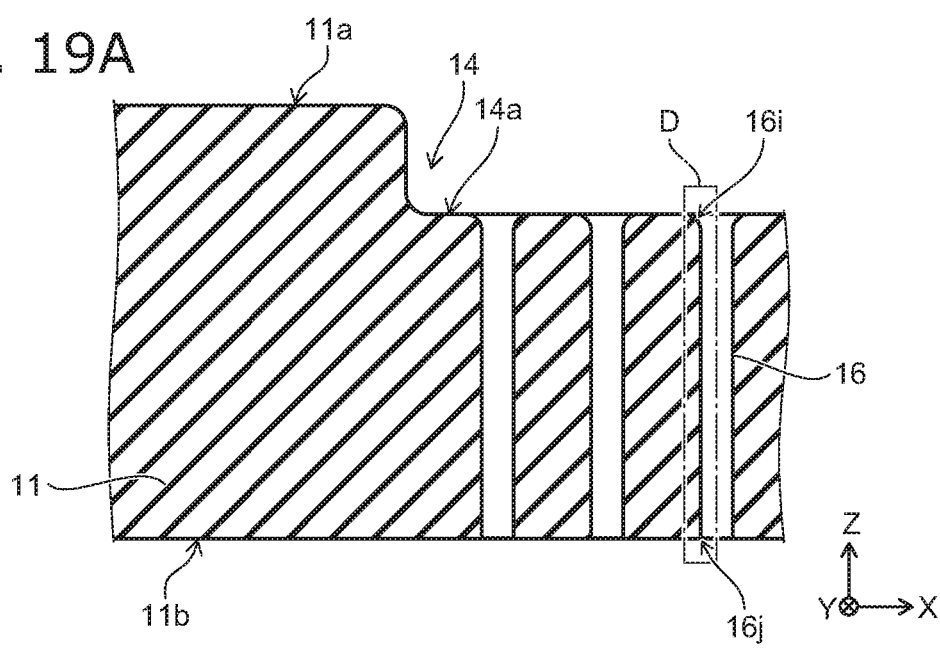
FIGS. 19A and 19B are schematic sectional views illustrating shapes of opening portion.
Figure 19B:
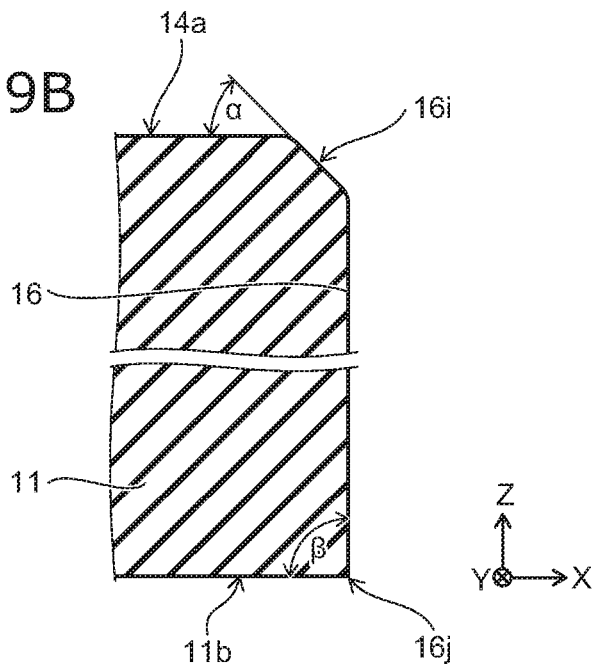

FIGS. 19A and 19B are schematic sectional views illustrating a shape of the opening portion of the hole 16.

FIG. 19B corresponds to an enlarged view of a region D shown in FIG. 19A. In FIG. 19A, the hole 16 has not a portion with the opening dimension of D3 shown in FIG. 18. That is, the opening dimension of the hole 16 corresponds to the opening dimension D4 shown in FIG. 18.

As shown in FIGS. 19A and 19B, an edge 16i of the opening on the first major surface 11a side (the surface 14a side of the groove 14) of the hole 16 can be inclined more smoothly than an edge 16j of the opening on the second major surface 11b side of the hole 16. In this example, in at least one of the plurality of holes 16, when an angle between the edge 16i of the opening on the groove 14 side of the hole 16 and the surface 14a on the second major surface 11b side of the groove 14 is taken a, and an angle between the edge 16j of the opening on the second major surface 11b side of the hole 16 and the second major surface 11b is taken as β, "α<β" is obtained. This can suppress the electric field concentration, and further the arc discharge can be reduced. In this example, the edge 16i is configured to be a straight line. However, the edge 16i may be configure to be a curve, and may be configured to be a straight line and a curve. When the edge 16i and the edge 16j are configured to be a curve, a curvature radius of the edge 16i can be larger than a curvature radius of the edge 16j. When the edge 16i and the edge 16j are configured to be a straight line and a curvature, it is sufficient that at least the relationship between the straight line portions and the relationship between the curve portions satisfies the relationship described above.

When the edge 16i is inclined more gradually than the edge 16j, the occurrence of chipping or the electric field concentration can be suppressed. Thus, the occurrence of arc discharge can be more effectively suppressed.

The shape of the opening portion of the hole 16 is illustrated as an example, however it is much the same for the hole 16 having a stepped structure or a tapered structure.

Figure 20:
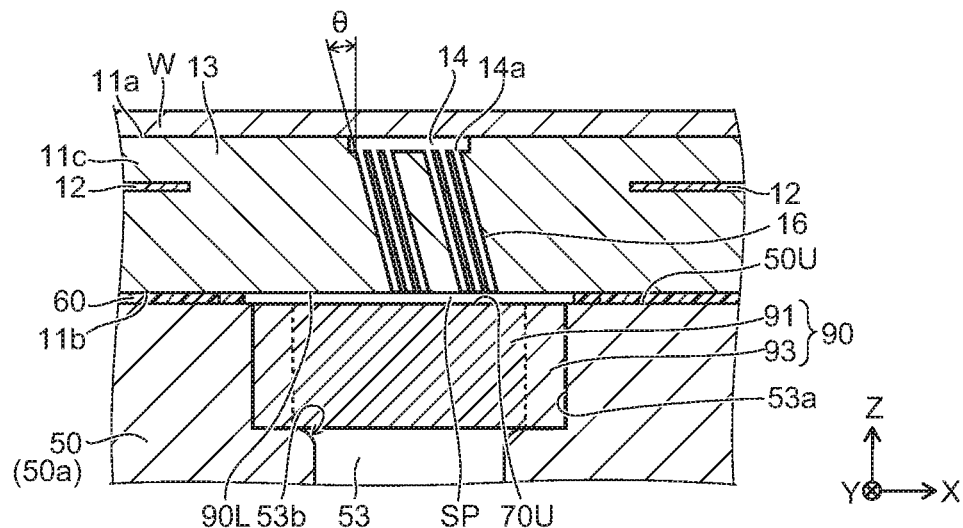
FIG. 20 is a schematic sectional view illustrating the electrostatic chuck according to the other embodiment.

FIG. 20 is a schematic sectional view illustrating the electrostatic chuck according to the other embodiment.

FIG. 20 corresponds to an enlarged view of the region C shown in FIG. 16.

Each of the plurality of holes 16 illustrated in FIG. 17A extends substantially in the Z-direction. On the contrary, at least one of the plurality of holes 16 illustrated in FIG. 20 can be inclined to the Z-direction. If at least one of the plurality of holes 16 extends in a direction inclined to the Z-direction, it is considered that electrons are less likely to be accelerated in current flow in the hole 16. Thus, the occurrence of arc discharge can be more effectively suppressed. According to knowledge obtained by the inventors, if the angle θ inclined to the Z-direction is not less than 5° and not more than 30°, preferably not less than 5° and not more than 15°, the occurrence of arc discharge can be suppressed without making the diameter of the hole 16 small.

The case of the hole 16 is illustrated as an example, however it is much the same for the hole 16h having the stepped structure or the tapered structure.

The hole 16 inclined to the Z-direction can be directly formed in the ceramic dielectric substrate 11c by laser irradiation or ultrasonic processing. Therefore, the region provided with at least one hole 16 inclined to the Z-direction includes the same material as the ceramic dielectric substrate 11.

Figure 21:
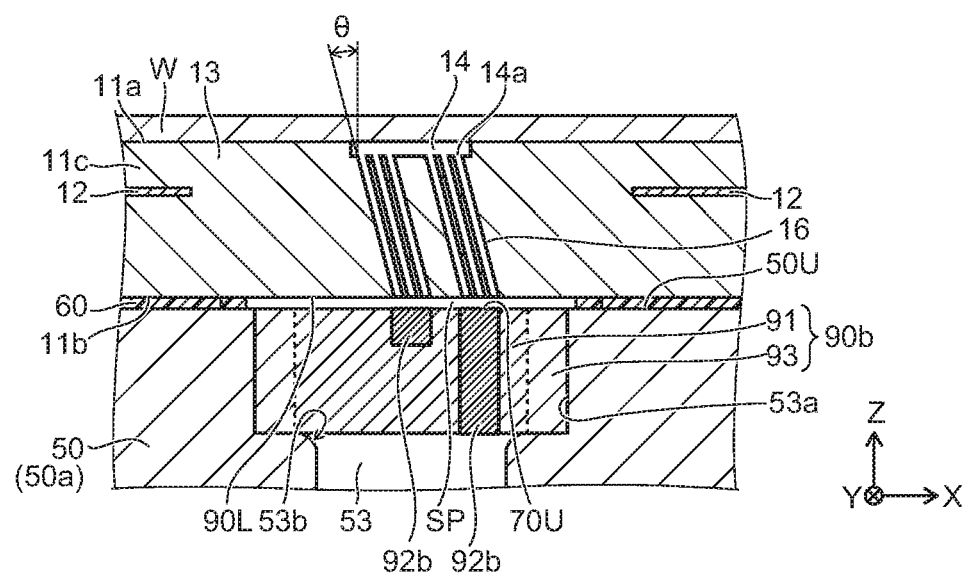
FIG. 21 is a schematic sectional view illustrating the electrostatic chuck according to the other embodiment.

FIG. 21 is a schematic sectional view illustrating the electrostatic chuck according to the other embodiment.

FIG. 21 corresponds to an enlarged view of the region C shown in FIG. 16.

As shown in FIG. 21, the porous region 91 of the porous part 90b further includes the dense part 92b. That is, the porous part 90b further adds the dense part 92b to the porous part 90 described above. That is, the dense part 92b can also be further added to the porous part 60 or the porous part 90 provided in the base plate 50.

As projected on a plane (XY-plane) perpendicular to the Z-direction, at least one of the openings on the dense part 92b side of the plurality of holes 16 can be configured to overlap the dense part 92b. A material, density, porosity e.g. of the plurality of dense parts 92b are as described above, for instance.

Figure 22:
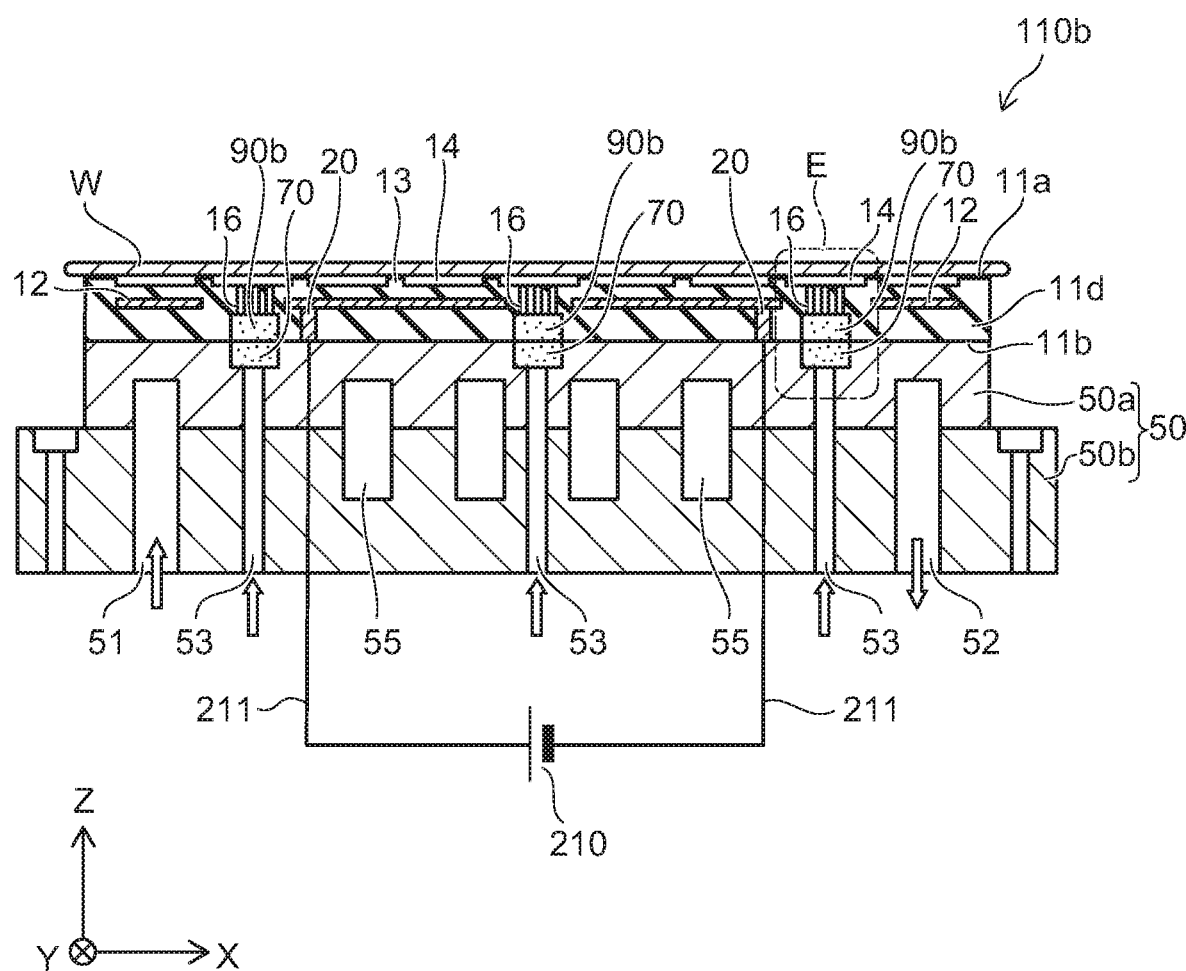
FIG. 22 is a schematic sectional view illustrating the electrostatic chuck according to the other embodiment.

FIG. 22 is a schematic sectional view illustrating an electrostatic chuck according to the other embodiment.

Figure 23:
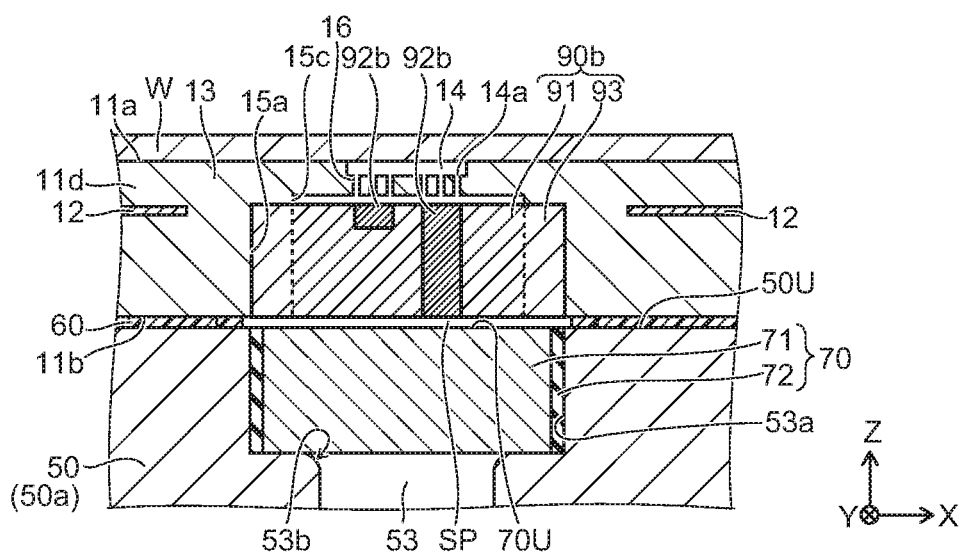
FIG. 23 is an enlarged view of the region E shown in FIG. 22.

FIG. 23 corresponds to an enlarged view of the region E shown in FIG. 22.

Figure 24:
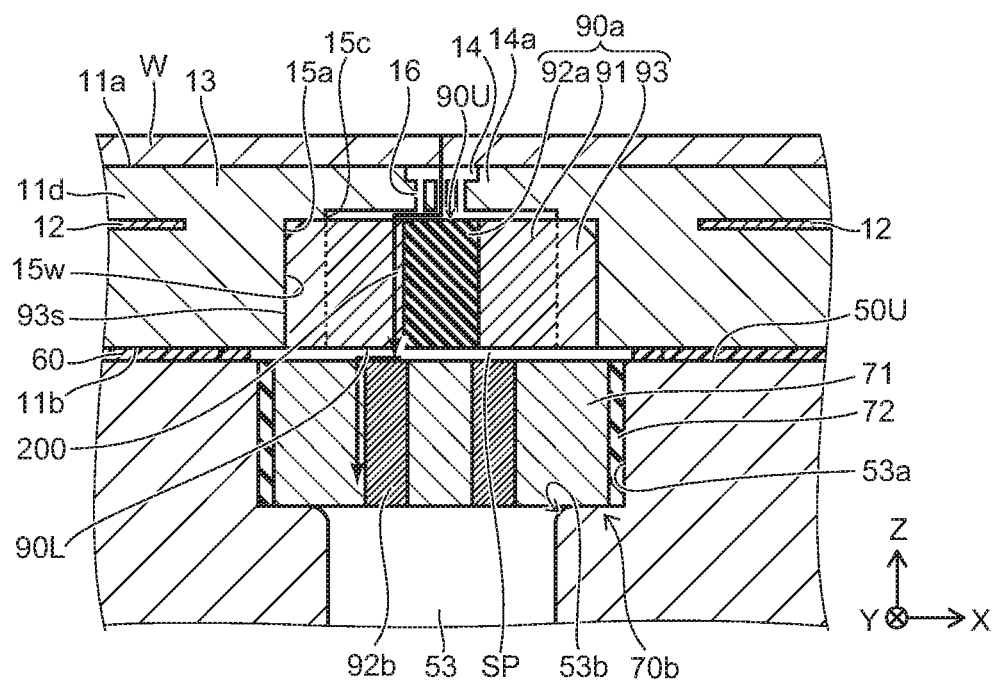
FIG. 24 is an enlarged view of the region E shown in FIG. 22 of the other embodiment.

FIG. 24 is an enlarged view showing the other embodiment of the region E shown in FIG. 22.

As shown in FIG. 22, FIG. 23, and FIG. 24, an electrostatic chuck 11b includes a ceramic dielectric substrate 11d, and the base plate 50. The ceramic dielectric substrate 11d is provided with the porous part 90b or the porous part 90a.

The ceramic dielectric substrate 11d is provided with the plurality of holes 16. The plurality of holes 16 can be formed in the ceramic dielectric substrate 11d, for instance, by laser irradiation or ultrasonic processing e.g. In this example, one end of the plurality of holes 16 is positioned on the surface 14a of the groove 14. The other end of the plurality of holes 16 is positioned on a bottom surface of the hole part 15c. That is, the plurality of holes 16 pierces the ceramic dielectric substrate 11d in the Z-direction.

As shown in FIG. 23, as projected on a plane (XY-plane) perpendicular to the Z-direction, at least one of the plurality of holes 16 can be configured to overlap the dense part 92b. A material, density, porosity e.g. of the dense part 92a are as described above, for instance.

(Processing Apparatus)

Figure 25:
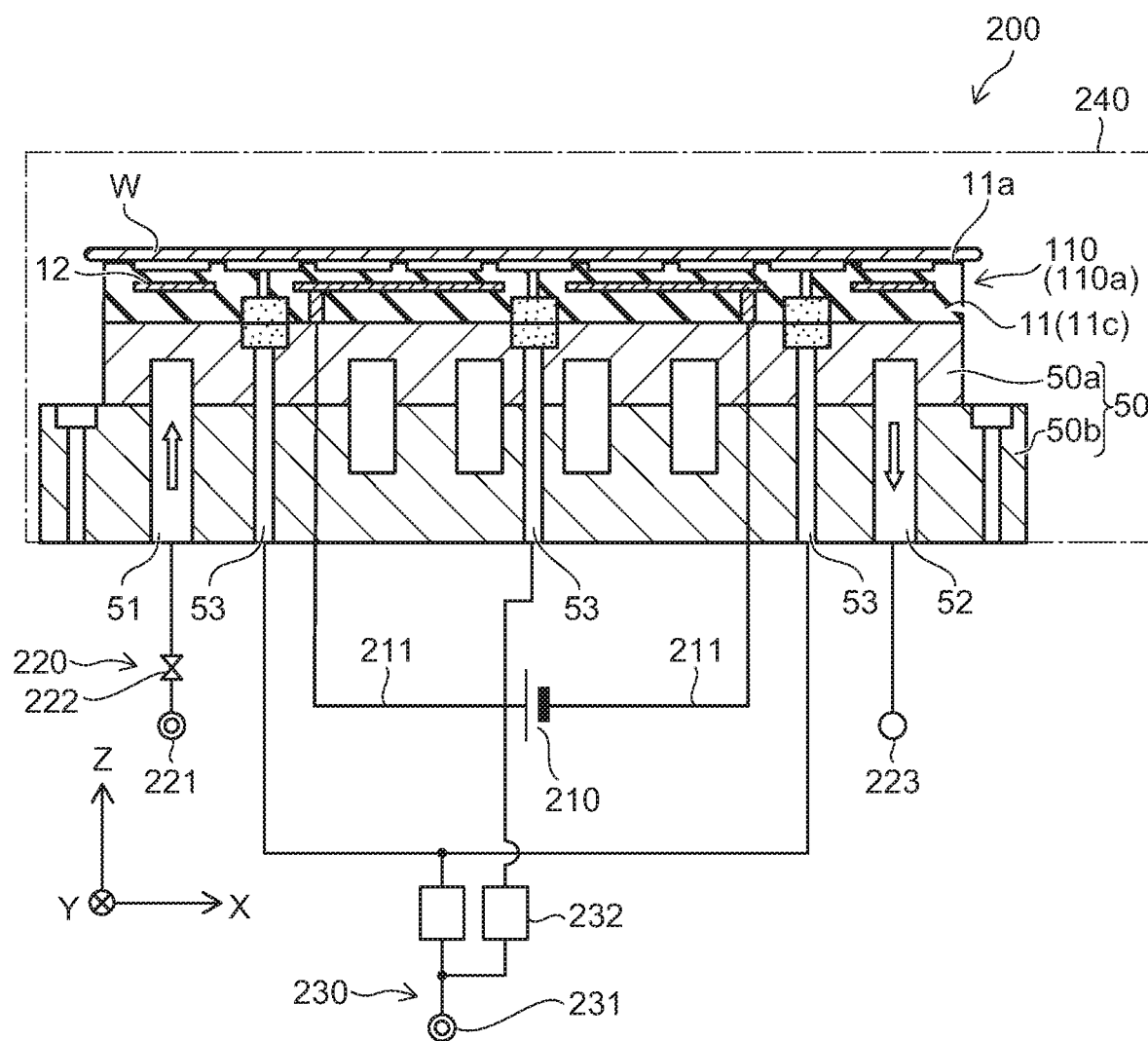
FIG. 25 is a schematic view illustrating a processing apparatus according to the embodiment.

FIG. 25 is a schematic view illustrating a processing apparatus 200 according to the embodiment.

As shown in FIG. 25, the processing apparatus 200 can be provided with the electrostatic chuck 110, a power supply 210, a medium supplier 220, and a supplier 230.

The power supply 210 is electrically connected to the electrode 12 provided in the electrostatic chuck 110. The power supply 210 can be, for instance, a direct current power supply. The power supply 210 applies a predetermined voltage to the electrode 12. The power supply 210 can also be provided with a switch for switching between voltage application and voltage application stop.

The medium supplier 220 is connected to the input channel 51 and the output channel 52. The medium supplier 220 can supply, for instance, liquid serving as a cooling medium or a heat insulation medium.

The medium supplier 220 includes, for instance, a storage part 221, a control valve 222, and an evacuation part 223.

The storage part 221 can be, for instance, a tank storing the liquid, or a factory pipe e.g. The storage part 221 can be provided with a cooling device or heating device for controlling the liquid temperature. The storage part 221 can also include a pump e.g. for pumping the liquid.

The control valve 222 is connected between the input channel 51 and the storage part 221. The control valve 222 can control at least one of a flow rate or a pressure of the liquid. The control valve 222 can switch liquid supply and supply stop.

The evacuation part 223 is connected to the output channel 52. The evacuation part 223 can be a tank or a drain pipe to recover the liquid evacuated from the output channel 52. The evacuation part 223 is not always necessary, and the liquid evacuated from the output channel 52 may be supplied to the storage part 221. This can circulate the cooling medium or the heat insulation medium, and thus resource saving is possible.

The supplier 230 includes a gas supplier 231 and a gas controller 232.

The gas supplier 231 can be a high pressure cylinder storing a gas such as He e.g. or a factory pipe e.g. The case where one gas supplier 231 is provided is illustrated, however a plurality of gas suppliers 231 may be provided.

The gas controller 232 is connected between the plurality of gas feed channel 53 and the gas supplier 231. The gas controller 232 can control at least one of a flow rate or a pressure of the gas. The gas controller 232 can be configured to further include function for switching gas supply and supply stop. The gas controller 232 can be, for instance, a mass flow controller or mass flow meter e.g.

As shown in FIG. 25, the gas controller 232 can be provided in a plurality. For instance, the gas controller 232 can be provided every plurality of regions of the first major surface 11a. This can perform control of the supplied gas every plurality of regions. In this case, the gas controller 232 can be provided every plurality of gas feed channel 53. This can perform control of the gas in the plurality of regions more precisely. The case where the plurality of gas controllers 232 are provided is illustrated, however one gas controller is sufficient as long as the gas controller 232 is possible to control independently the gas supply in the plurality of gas supply systems.

Here, there is a vacuum chuck and a mechanical chuck e.g. as means for holding the target W. However, the vacuum chuck cannot be used in environment reduced from atmosphere. When the mechanical chuck is used, the target W may be damaged and particles may occur. Therefore, for instance, an electrostatic chuck is used for a processing apparatus used in a semiconductor manufacturing process e.g.

In the processing apparatus like this, a processing space is needed to be isolated from external environment. Thus, the processing apparatus 200 can further include a chamber 240. The chamber 240 can be configured to have an airtight structure possible to maintain the environment reduced from the atmosphere.

The processing apparatus 200 can include a plurality of lift pins and a drive device lifting the plurality of lift pins. When the target W is received from a transfer device or the target W is handed over to the transfer device, the lift pin is raised by the drive device and protrudes from the first major surface 11a. When the target W received from the transfer device is placed on the first major surface 11a, the lift pin is lowered by the drive device and is stored in the ceramic dielectric substrate 11.

The processing apparatus 200 can be provided with various devices depending on processing contents. For instance, a vacuum pump evacuating the interior of the chamber 240 can be provided. A plasma generation device generating plasma in the interior of the chamber 240 can be provided. A process gas supplier supplying the process gas into the interior of the chamber 240 can be provided. A heater heating the target W and the process gas in in the interior of the chamber 2340 can also be provided. The devices provided in the processing apparatus 200 are not limited to the illustration. Well known arts can be applied to the devices provided in the processing apparatus 200, and thus detailed description will be omitted.

The embodiments of the invention have been described above. However, the invention is not limited to the above description. For instance, the electrostatic chuck 110 has been illustrated with reference to the configuration based on the Coulomb force. However, the electrostatic chuck 110 is also applicable to the configuration based on the Johnsen-Rahbek force. Those skilled in the art can appropriately modify the above embodiments, and such modifications are also encompassed within the scope of the invention as long as they include the features of the invention. Furthermore, various components in the above embodiments can be combined with each other as long as technically feasible. Such combinations are also encompassed within the scope of the invention as long as they include the features of the invention.

What is claimed is:

1. An electrostatic chuck, comprising:
    a ceramic dielectric substrate including a first major surface, a second major surface, and at least one groove, the first major surface configured to receive a suction target thereon, the second major surface being opposite to the first major surface;
    a base plate supporting the ceramic dielectric substrate and including a gas feed channel; and
    a first porous part provided between the groove and the gas feed channel,
    the ceramic dielectric substrate having a plurality of holes formed therein, the holes communicating with the groove and the gas feed channel and piercing the ceramic dielectric substrate in a first direction from the base plate toward the ceramic dielectric substrate,
    the first porous part including a porous region including a plurality of pores, and a dense region denser than the porous region, the first porous part further including at least one dense part different from said dense region, the dense part being embedded in and surrounded by the porous region, the dense part being exposed on an end face on a plurality of holes side of the porous region,
    wherein as projected on a plane perpendicular to the first direction, at least one of the plurality of holes provided in the ceramic dielectric substrate is configured to overlap at least a portion of the dense part.

2. The electrostatic chuck according to claim 1, wherein the first porous part is provided in the ceramic dielectric substrate.

3. The electrostatic chuck according to claim 1, further comprising a second porous part provided between the groove and the gas feed channel, the second porous part being provided in the base plate.

4. The electrostatic chuck according to claim 1, wherein a length along the first direction of the dense part is smaller than a length along the first direction of the first porous part.

5. The electrostatic chuck according to claim 1, wherein a length along the first direction of the dense part is substantially equal to a length along the first direction of the first porous part.

6. The electrostatic chuck according to claim 1, wherein at least a part of an edge of an opening on the ceramic dielectric substrate side of the gas feed channel is configured to be a curve.

7. The electrostatic chuck according to claim 1, wherein at least one of the plurality of holes provided in the ceramic dielectric substrate includes a first portion opening to the groove and a second portion communicating with the first portion and opening to the second major surface, and
    in the second direction substantially orthogonal to the first direction, a dimension of the first portion is smaller than a dimension of the second portion.

8. A processing apparatus, comprising:
    the electrostatic chuck according to claim 1; and
    a supplier configured to supply a gas in a gas feed channel provided in the electrostatic chuck.

9. The electrostatic chuck according to claim 1, wherein the dense part is situated proximate a radially central portion of the first porous part.

10. An electrostatic chuck, comprising:
    a ceramic dielectric substrate including a first major surface, a second major surface, and at least one groove, a suction target being placed on the first major surface, the second major surface being opposite to the first major surface;
    a base plate supporting the ceramic dielectric substrate and including a gas feed channel; and
    a first porous part provided between the groove and the gas feed channel,
    the ceramic dielectric substrate including a plurality of holes communicating with the groove and the gas feed channel and piercing the ceramic dielectric substrate in a first direction from the base plate toward the ceramic dielectric substrate,
    the first porous part including at least one porous region including a plurality of pores, and at least one dense region denser than the porous region, the porous region further including at least one dense part,
    wherein:
    as projected on a plane perpendicular to the first direction, at least one of the plurality of holes provided in the ceramic dielectric substrate is configured to overlap at least a portion of the dense part,
    the porous region includes a plurality of sparse portions having a plurality of pores, and a dense portion having a density higher than a density of the sparse portions, the dense portion having a dimension, in a second direction substantially perpendicular to the first direction, smaller than a dimension of the dense region in the second direction,
    each of the plurality of sparse portions extends in the first direction,
    the dense portion is positioned between the plurality of the sparse portions,
    the sparse portions including a wall part provided between the plurality of pores, and
    in the second direction substantially perpendicular to the first direction, a minimum value of a dimension of the wall part is smaller than a minimum value of the dimension of the dense portion.

11. The electrostatic chuck according to claim 10, wherein in the second direction, a dimension of the plurality of pores provided in each of the plurality of sparse portions is smaller than the dimension of the dense portion.

12. The electrostatic chuck according to claim 10, wherein an aspect ratio of the plurality of pores provided in each of the plurality of sparse portions is 30 or more.

13. The electrostatic chuck according to claim 10, wherein in the second direction, a dimension of the plurality of pores provided in each of the plurality of sparse portions is not less than 1 micrometer and not more than 20 micrometers.

14. The electrostatic chuck according to claim 10, wherein as viewed along the first direction, the plurality of pores include a first pore positioned at a center of the sparse portions, and among the plurality of pores, a number of pores adjacent to and surrounding the first pore is 6.

15. An electrostatic chuck, comprising:
- a ceramic dielectric substrate including a first major surface, a second major surface, and at least one groove, a suction target being placed on the first major surface, the second major surface being opposite to the first major surface;
- a base plate supporting the ceramic dielectric substrate and including a gas feed channel; and
- a first porous part provided between the groove and the gas feed channel, the ceramic dielectric substrate including a plurality of holes communicating with the groove and the gas feed channel and piercing the ceramic dielectric substrate in a first direction from the base plate toward the ceramic dielectric substrate, the first porous part including at least one porous region including a plurality of pores, and at least one dense region denser than the porous region, the porous region further including at least one dense part, wherein as projected on a plane perpendicular to the first direction, at least one of the plurality of holes provided in the ceramic dielectric substrate is configured to overlap at least a portion of the dense part, and wherein at least one of the plurality of holes provided in the ceramic dielectric substrate satisfies $\alpha < \beta$, when an angle between an edge of an opening of the holes on the groove side and a bottom surface of the groove is taken as a, and an angle between an edge of an opening of the holes on the second major surface side and the second major surface is taken as $\beta$.

* * * * *